US012661693B2

(12) United States Patent
Deguchi

(10) Patent No.: US 12,661,693 B2
(45) Date of Patent: Jun. 23, 2026

(54) SUBSTRATE PROCESSING MODULE AND SUBSTRATE PROCESSING DEVICE PROVIDED WITH SAME

(71) Applicant: DAIKIN FINETECH, LTD., Yamatokoriyama (JP)

(72) Inventor: Yasunori Deguchi, Yamatokoriyama (JP)

(73) Assignee: DAIKIN FINETECH, LTD., Yamatokoriyama (JP)

( * ) Notice: Subject to any disclaimer, the term of this patent is extended or adjusted under 35 U.S.C. 154(b) by 98 days.

(21) Appl. No.: 18/693,072

(22) PCT Filed: Dec. 27, 2021

(86) PCT No.: PCT/JP2021/048655
§ 371 (c)(1),
(2) Date: Mar. 18, 2024

(87) PCT Pub. No.: WO2023/127049
PCT Pub. Date: Jul. 6, 2023

(65) Prior Publication Data
US 2024/0383015 A1 Nov. 21, 2024

(51) Int. Cl.
B08B 3/08 (2006.01)
B08B 13/00 (2006.01)
H10P 72/00 (2026.01)

(52) U.S. Cl.
CPC ............... B08B 3/08 (2013.01); B08B 13/00 (2013.01); *H10P 72/0416* (2026.01)

(58) Field of Classification Search
CPC ...... B08B 3/08; B08B 13/00; H01L 21/67057
(Continued)

(56) References Cited

U.S. PATENT DOCUMENTS

| | | | |
|---|---|---|---|
| 6,345,947 B1 | 2/2002 | Egashira | |
| 2002/0031421 A1 | 3/2002 | Egashira | |
| 2018/0090341 A1 | 3/2018 | Yamaguchi | |

FOREIGN PATENT DOCUMENTS

| | | |
|---|---|---|
| JP | H11-145249 A | 5/1999 |
| JP | 2000-306880 A | 11/2000 |

(Continued)

OTHER PUBLICATIONS

JP2000306880A—machine translation (Year: 2003).*
(Continued)

*Primary Examiner* — Tinsae B Ayalew
(74) *Attorney, Agent, or Firm* — HSML P.C.

(57) ABSTRACT
A substrate processing module of a substrate processing device includes a first tank and a second tank and that are arranged in a first direction and in which a substrate can be disposed, and two first transport units and that transport the substrate. One first transport unit includes a second chuck that is movable up and down and is disposed in the second tank in a state of holding the substrate, and the other first transport unit includes a first chuck that is movable up and down and is disposed in the first tank in a state of holding the substrate. At least one of the second chuck and the first chuck is movable between a position above the second tank and a position above the first tank. The second chuck and the first chuck are configured to be able to transfer the substrate therebetween.

8 Claims, 23 Drawing Sheets

(58) Field of Classification Search
USPC ........................................................... 134/66
See application file for complete search history.

(56) References Cited

FOREIGN PATENT DOCUMENTS

| | | | |
|---|---|---|---|
| JP | 2018-056158 | A | 4/2018 |
| JP | 2021-048271 | A | 3/2021 |
| JP | 2021-072439 | A | 5/2021 |
| KR | 100483753 | B1 * | 4/2005 ....... H01L 21/67242 |

OTHER PUBLICATIONS

KR100483753B1—machine translation (Year: 2005).*
International Search Report of PCT/JP2021/048655, Mar. 15, 2022, 2 pages.
International Preliminary Report on Patentability, International Patent Application No. PCT/JP2021/048655, mailed Jul. 11, 2024 (5 pages).

* cited by examiner

SUBSTRATE PROCESSING MODULE AND SUBSTRATE PROCESSING DEVICE PROVIDED WITH SAME

TECHNICAL FIELD

The present disclosure relates to a substrate processing module for processing a substrate and a substrate processing device including the same.

BACKGROUND ART

Patent Document 1 discloses a substrate processing device in which a plurality of pairs of a chemical liquid tank and a cleaning tank are disposed in a longitudinal direction of the device, and a main transport mechanism and a sub-transport mechanism are included. The main transport mechanism moves a plurality of substrates in the longitudinal direction from one end side to the other end side of the device. The sub-transport mechanism moves the plurality of substrates in the longitudinal direction and the vertical direction within a range of the pair of chemical liquid tank and the cleaning tank.

PRIOR ART DOCUMENT

Patent Document

Patent Document 1: JP-A-2018-56158

SUMMARY OF THE DISCLOSURE

Problems to be Solved by the Disclosure

An object of the present disclosure is, in a substrate processing device that processes a substrate using a plurality of tanks, to improve a throughput of the substrate processing device by increasing an operating rate of each of the plurality of tanks.

Solutions to the Problems

In order to solve the above problem, according to one aspect of the present disclosure,
provided is a substrate processing module including:
a first tank and a second tank that are arranged in a first direction and in which a substrate can be disposed; and
two first transport units that transport the substrate,
in which one of the first transport units includes a first chuck that is movable up and down and is disposed in the first tank in a state of holding a substrate,
the other of the first transport units includes a second chuck that is movable up and down and is disposed in the second tank in a state of holding a substrate,
at least one of the first chuck and the second chuck is movable between a position above the first tank and a position above the second tank, and
the first chuck and the second chuck are configured to be able to transfer a substrate between the first chuck and the second chuck.
According to another aspect of the present disclosure,
provided is a substrate processing device including the substrate processing module and another module connected to the substrate processing module in the second direction intersecting the first direction.

Effects of the Disclosure

According to the present disclosure, in a substrate processing device that processes a substrate using a plurality of tanks, a throughput of the substrate processing device can be improved by increasing an operating rate of each of the plurality of tanks.

DETAILED DESCRIPTION

A substrate processing module according to an aspect of the present disclosure includes: a first tank and a second tank that are arranged in a first direction and in which a substrate can be disposed; and two first transport units that transport the substrate, in which one of the first transport units includes a first chuck that is movable up and down and is disposed in the first tank in a state of holding a substrate, the other of the first transport units includes a second chuck that is movable up and down and is disposed in the second tank in a state of holding a substrate, at least one of the first chuck and the second chuck is movable between a position above the first tank and a position above the second tank, and the first chuck and the second chuck are configured to be able to transfer a substrate between the first chuck and the second chuck.

According to such an aspect, in a substrate processing device that processes a substrate using a plurality of tanks, a throughput of the substrate processing device can be improved by increasing an operating rate of each of the plurality of tanks.

For example, the first chuck may be a comb-shaped chuck on which the substrate is placed, the second chuck may be a comb-shaped chuck on which the substrate is placed, and the first chuck and the second chuck may pass through each other in an elevating direction.

For example, the first tank may be a cleaning tank, and the second tank may be a chemical liquid tank that stores a chemical liquid in which the substrate is immersed.

For example, the second chuck may be movable between the position above the first tank and the position above the second tank.

For example, the first chuck may receive the substrate held by the second chuck at the position above the first tank.

For example, the substrate processing module may further include a second transport unit that transports the substrate in a second direction intersecting the first direction.

For example, the second transport unit may supply the substrate to the second chuck and collect the substrate held by the first chuck.

The second transport unit may supply the substrate to the second chuck and collect the substrate supported by the first chuck at the position above the first tank.

A substrate processing device according to another aspect of the present disclosure includes: the substrate processing module; and another module connected to the substrate processing module in the second direction intersecting the first direction.

According to such an aspect, in a substrate processing device that processes a substrate using a plurality of tanks, a throughput of the substrate processing device can be improved by increasing an operating rate of each of the plurality of tanks.

Hereinafter, embodiments of the present disclosure will be described with reference to the drawings.

First Embodiment

Figure 1:
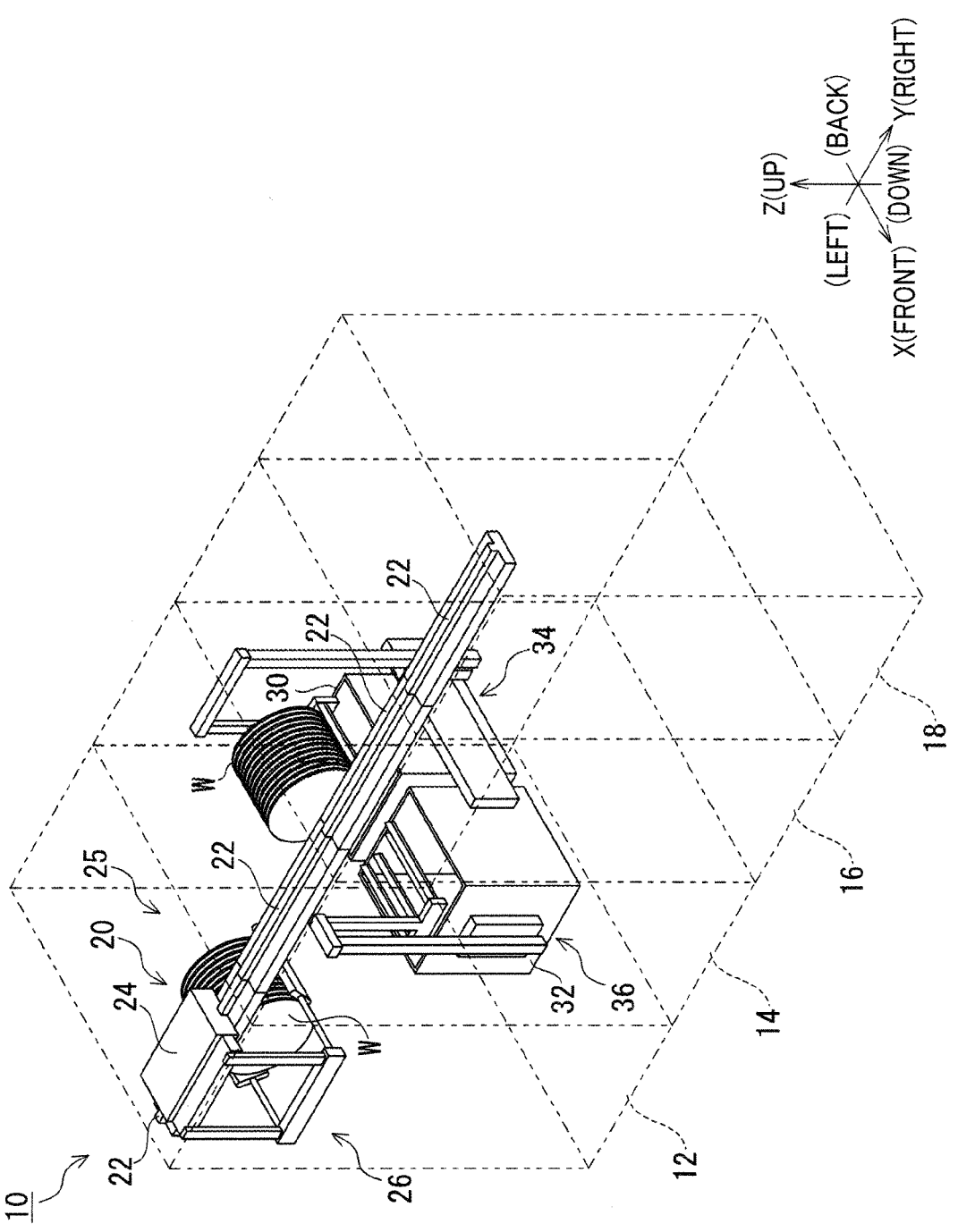
FIG. 1 is a perspective view of a substrate processing device according to a first embodiment of the present disclosure.

FIG. 1 is a perspective view of a substrate processing device according to a first embodiment of the present disclosure. Note that the X-Y-Z orthogonal coordinate system illustrated in the drawings is for facilitating understanding of the disclosure, and does not limit the disclosure. The X-axis direction is a front-back direction (first direction) of the substrate processing device, the Y-axis direction is a left-right direction (second direction), and the Z-axis direction is a height direction (third direction).

As illustrated in FIG. 1, a substrate processing device 10 according to the present first embodiment is a device for processing a substrate W, and is configured by connecting a plurality of modules having different functions in the Y-axis direction (second direction). The substrate W is a circular thin plate, and is, for example, a semiconductor substrate, a glass substrate for a liquid crystal display device, a glass substrate for a photomask, a substrate for an optical disk, a MEMS sensor substrate, a panel for a solar cell, or the like.

In the case of the present first embodiment, the substrate processing device 10 includes a loading module 12, a chemical module (substrate processing module) 14, a drying module 16, and an unloading module 18. The modules 12, 14, 16, and 18 are connected in the Y-axis direction (second direction). The substrate W is loaded from the outside into the loading module 12, and the chemical module 14 performs chemical liquid treatment on the substrate W loaded into the loading module 12. In the drying module 16, the substrate W that has been treated in the chemical module 14 is subject to a drying process. The substrate W dried by the drying module 16 is unloaded from the unloading module 18 to the outside. Note that the configuration of the modules may be changed according to the type of the substrate W and the processing contents. For example, the substrate processing device 10 may include a plurality of the chemical modules 14 that perform different treatments on the substrate W.

Furthermore, the substrate processing device 10 includes a second transport unit 20 that transports the substrate W in the Y-axis direction (second direction) between the plurality of modules. The second transport unit 20 includes an actuator 25 and a chuck 26 moved in the Y-axis direction by the actuator 25. The actuator 25 includes, for example, a rail 22 provided and connected to each of the plurality of modules 12 to 18 and a moving head 24 (moving body) that moves according to the rail 22. The chuck 26 is supported by the moving head 24 to hold the substrate W. When the moving head 24 moves in the Y-axis direction in which the plurality of modules 12 to 18 are lined up along the rail 22, the chuck 26 moves so as to pass through each of the plurality of modules 12 to 18. Note that details of the second transport unit 20 will be described later. As a result, a plurality of substrates Ware transported in the second direction.

Figure 2:
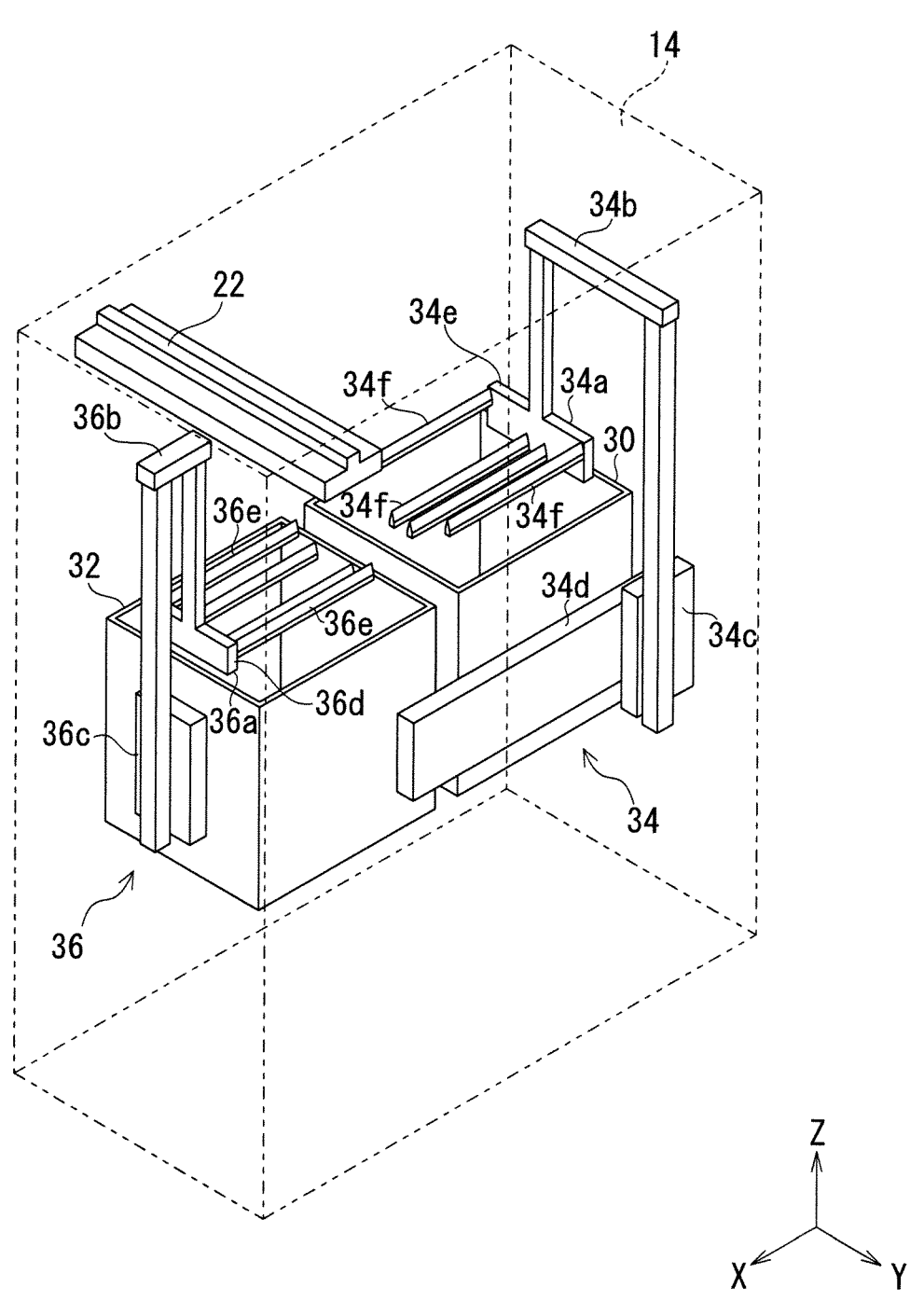
FIG. 2 is a perspective view of a chemical module in the substrate processing device.

FIG. 2 is a schematic perspective view of the chemical module in the substrate processing device.

In the chemical module 14 illustrated in FIG. 2, as the treatment for the substrate W, for example, various chemical liquid treatments such as ammonium hydroxide-hydrogen peroxide mixture (APM) cleaning, sulfuric acid-hydrogen peroxide mixture (SPM) cleaning, hydrochloric acid-hydrogen peroxide mixture (HPM) cleaning, and diluted hydrofluoric acid (DHF) cleaning, and various chemical liquid treatments such as etching and resist peeling are performed. These chemical liquid treatments can be arbitrarily combined depending on the type of chemical liquid treatment for the substrate W.

The chemical module 14 of the substrate processing device 10 includes a first tank 32 and a second tank 30 which are arranged in the X-axis direction (first direction) and in which the substrate W can be disposed as processing tanks for processing the substrate W. The second tank 30 is located on a rear side of the substrate processing device 10, and the first tank 32 is located on a front side of the substrate processing device 10. Note that, in the case of the present first embodiment, the second tank 30 is a chemical liquid tank that stores a chemical liquid in which the substrate W is immersed, and the first tank 32 is a cleaning tank that stores a cleaning liquid such as pure water in which the substrate W treated with the chemical liquid is immersed.

Furthermore, the chemical module 14 of the substrate processing device 10 includes a plurality of first transport units 34 and 36 that raise and lower the substrate W in the Z-axis direction (third direction).

Figure 3A:
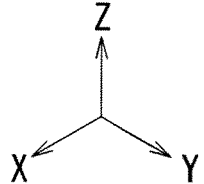
FIG. 3A is a perspective view illustrating a state in which a first chuck of one first transport unit and a second chuck of the other first transport unit are located above the first tank and the second tank, respectively.
Figure 3B:
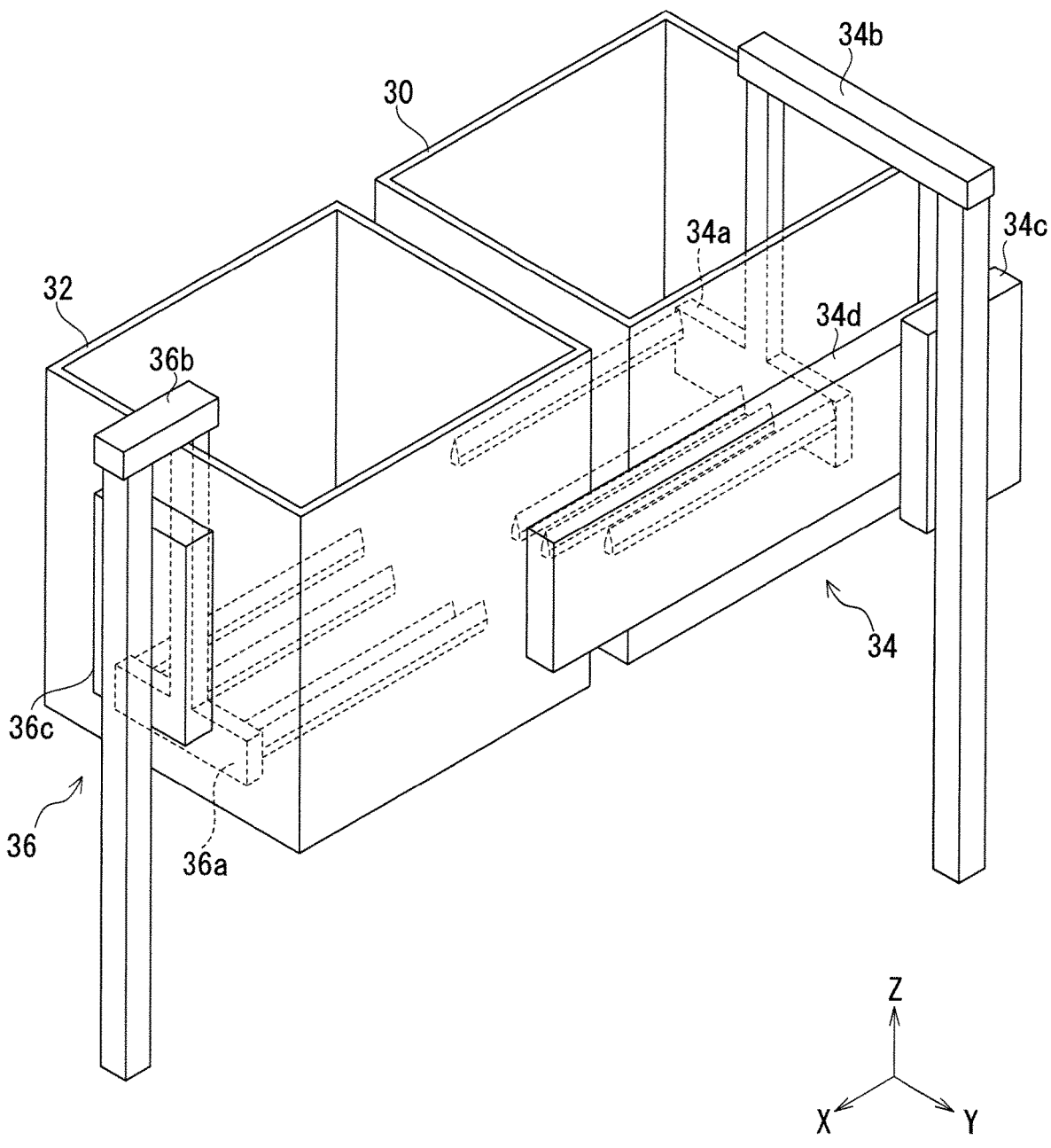
FIG. 3B is a perspective view illustrating a state in which the first chuck of one first transport unit and the second chuck of the other first transport unit are located inside the first tank and the second tank, respectively.
Figure 3C:
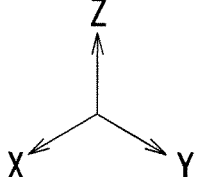
FIG. 3C is a perspective view illustrating a state in which both the first chuck of one first transport unit and the second chuck of the other first transport unit are located above the first tank.

FIG. 3A is a perspective view illustrating a state in which a first chuck of one first transport unit and a second chuck of the other first transport unit are located above the first tank and the second tank, respectively. Furthermore, FIG. 3B is a perspective view illustrating a state in which the first chuck of one first transport unit and the second chuck of the other first transport unit are located inside the first tank and the second tank, respectively. Then, FIG. 3C is a perspective view illustrating a state in which both the first chuck of one first transport unit and the second chuck of the other first transport unit are located above the first tank.

Figure 4A:
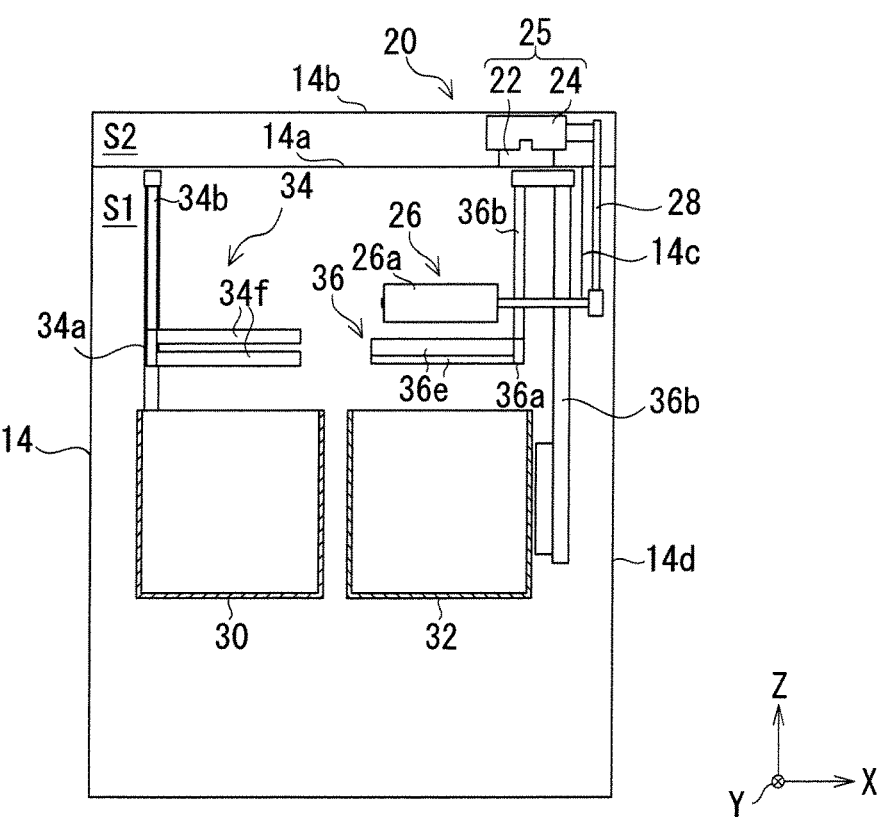
FIG. 4A is a side view illustrating a state in which a first chuck of one first transport unit and a second chuck of the other first transport unit are located above the first tank and the second tank, respectively.

Moreover, FIG. 4A is a side view illustrating a state in which the first chuck of one first transport unit and the second chuck of the other first transport unit are located above the first tank and the second tank, respectively.

Figure 4B:
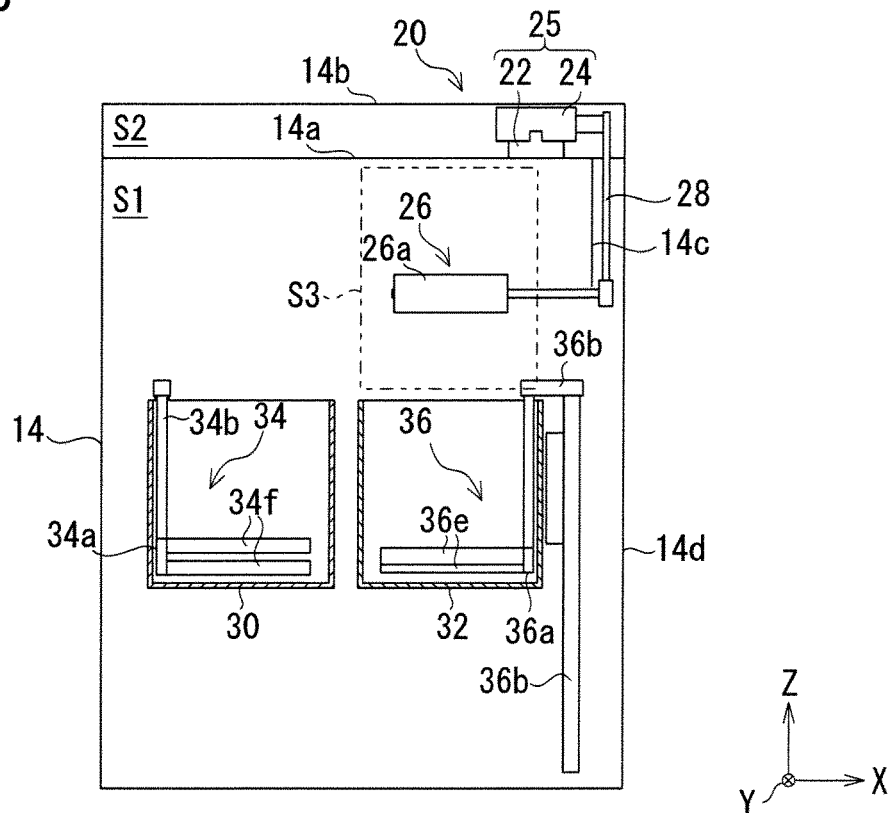
FIG. 4B is a side view illustrating a state in which the first chuck of one first transport unit and the second chuck of the other first transport unit are located inside the first tank and the second tank, respectively.
Figure 4C:
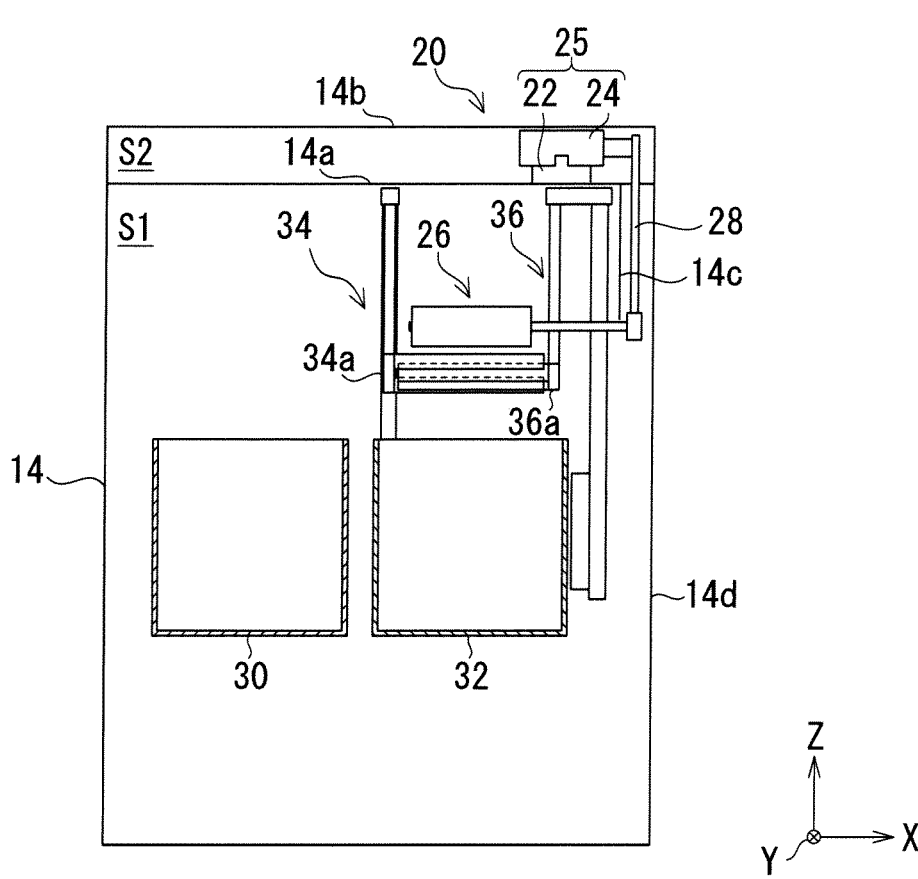
FIG. 4C is a side view illustrating a state in which both the first chuck of one first transport unit and the second chuck of the other first transport unit are located above the first tank.

Furthermore, FIG. 4B is a side view illustrating a state in which the first chuck of one first transport unit and the second chuck of the other first transport unit are located inside the first tank and the second tank, respectively. Then, FIG. 4C is a side view illustrating a state in which both the first chuck of one first transport unit and the second chuck of the other first transport unit are located above the first tank. Note that FIGS. 3A and 4A correspond to each other, FIGS. 3B and 4B correspond to each other, and FIGS. 3C and 4C correspond to each other.

As illustrated in FIGS. 3A to 3C and FIGS. 4A to 4C, in the case of the present first embodiment, the other first transport unit 34 includes a second chuck 34a that holds the plurality of substrates W, an arm 34b that supports the second chuck 34a, an actuator 34c that raises and lowers the arm 34b in the Z-axis direction (third direction), and an actuator 34d that moves the actuator 34c in the X-axis direction (first direction).

The second chuck 34a can be moved up and down by the actuator 34c. As a result, the second chuck 34a can be disposed in the second tank 30 as illustrated in FIGS. 3B and 4B. Furthermore, the actuator 34d allows the second chuck 34a to move between a position above the second tank 30 and a position above the first tank 32 as illustrated in FIGS. 3A, 3C, 4A, and 4C.

In the case of the present first embodiment, one first transport unit 36 includes a first chuck 36a that holds the plurality of substrates W, an arm 36b that supports the first chuck 36a, and an actuator 36c that raises and lowers the arm 36b in the Z-axis direction (third direction).

The first chuck 36a can be moved up and down by the actuator 36c. As a result, the first chuck 36a can be disposed in the first tank 32 as illustrated in FIGS. 3B and 4B. Note that, in the case of the present first embodiment, the first chuck 36a does not move in the X-axis direction (first direction) unlike the second chuck 34a.

Furthermore, as illustrated in FIG. 3A, the actuator 34c and the actuator 34d of the first transport unit 34 are disposed on one side (right side in the case of the present first embodiment) in the Y-axis direction (second direction) with respect to the second tank 30. The actuator 36c of the first transport unit 36 is provided on one side in the X-axis direction (first direction) with respect to the first tank 32, that is, in front of the first tank 32 (on an opposite side of the second tank 30 across the first tank 32).

As illustrated in FIG. 3A, in the case of the present first embodiment, the second chuck 34a of the first transport unit 34 and the first chuck 36a of the first transport unit 36 have shapes corresponding to each other so that the substrate W can be transferred to and from each other.

For example, in the case of the present first embodiment, the second chuck 34a and the first chuck 36a are comb-shaped chucks in an upward view (as viewed in the Z-axis direction).

Specifically, the second chuck 34a includes a main body portion 34e connected to the arm 34b, and a plurality of support rods 34f extending forward in the X-axis direction (first direction) from the main body portion 34e and on which the plurality of substrates W is placed. Similarly, the first chuck 36a includes a main body portion 36d connected to the arm 36b, and a plurality of support rods 36e extending rearward in the X axis direction from the main body portion 36d and on which the plurality of substrates W is placed. Each of the support rods 34f and 36e is formed with a plurality of grooves (not illustrated) that are engaged with outer circumferential ends of the plurality of substrates W to maintain the plurality of substrates W in a state of being spaced apart from each other by a predetermined interval. As a result, the plurality of substrates W are held by the first and second chucks 36a and 34a in a state of being overlapped at intervals in the X-axis direction. Note that, in the present first embodiment, the second chuck 34a and the first chuck 36a include four support rods 34f and 36e, respectively. The number of support rods on which the substrates W are placed may be three or more, and the second chuck 34a and the first chuck 36a may be different from each other.

Furthermore, in the case of the present first embodiment, the second chuck 34a and the first chuck 36a are configured such that the plurality of support rods 34f and 36e can pass through each other in the Z-axis direction (third direction).

Figure 5:
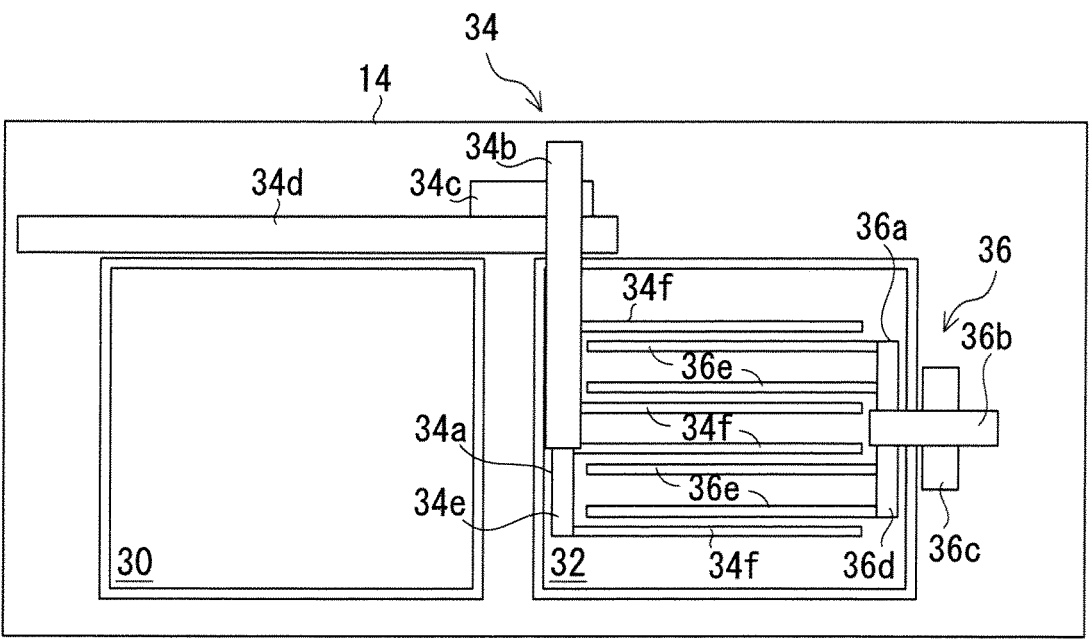
FIG. 5 is a top view illustrating a state in which both the first chuck of one first transport unit and the second chuck of the other first transport unit are located above the first tank.
Figure 5:
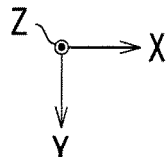
Figure 6:
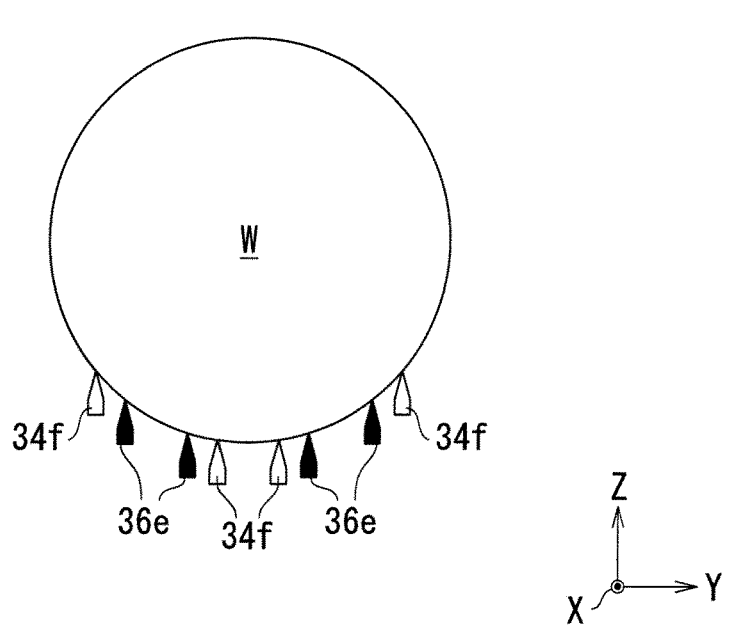
FIG. 6 is a diagram illustrating transfer of a substrate between the first chuck and the second chuck.

FIG. 5 is a top view illustrating a state in which both the first chuck of one first transport unit and the second chuck of the other first transport unit are located above the first tank. Furthermore, FIG. 6 is a diagram illustrating transfer of the substrate between the first chuck and the second chuck. As illustrated in FIG. 5, in the case of the present first embodiment, the transfer of the plurality of substrates W between the second chuck 34a and the first chuck 36a is performed above the first tank 32. At the time of transferring the substrate W, the plurality of support rods 34f of the second chuck 34a and the plurality of support rods 36e of the first chuck 36a are located between the main body portion 34e of the second chuck 34a and the main body portion 36d of the first chuck 36a. As a result, as illustrated in FIG. 6, the plurality of support rods 34f of the second chuck 34a and the plurality of support rods 36e of the first chuck 36a can simultaneously contact the plurality of substrates W.

Furthermore, as illustrated in FIGS. 5 and 6, at the time of transferring the substrate W, the support rods 34f of the second chuck 34a and the plurality of support rods 36e of the first chuck 36a do not overlap each other in the Z-axis direction (third direction) of the first and second chucks 36a and 34a. Therefore, the first and second chucks 36a, 34a can pass in the Z-axis direction with respect to each other without contact between the support rods of each other. For example, when the second chuck 34a is lowered from the state illustrated in FIG. 6, the plurality of substrates W remain on the plurality of support rods 36e of the first chuck 36a, and the plurality of substrates W are transferred to the first chuck 36a.

In the case of the present first embodiment, the plurality of substrates W are supplied from the loading module 12 to the second chuck 34a of the first transport unit 34 by the second transport unit 20, and then transferred from the second chuck 34a to the first chuck 36a of the first transport unit 36. Then, the plurality of substrates W on the first chuck 36a are collected by the second transport unit 20 and transported to the drying module 16. In the case of the present first embodiment, the supply of the substrate W to the second chuck 34a of the first transport unit 34 and the collection of the substrate W from the first chuck 36a of the first transport unit 36 are executed by the common second transport unit 20.

Figure 7:
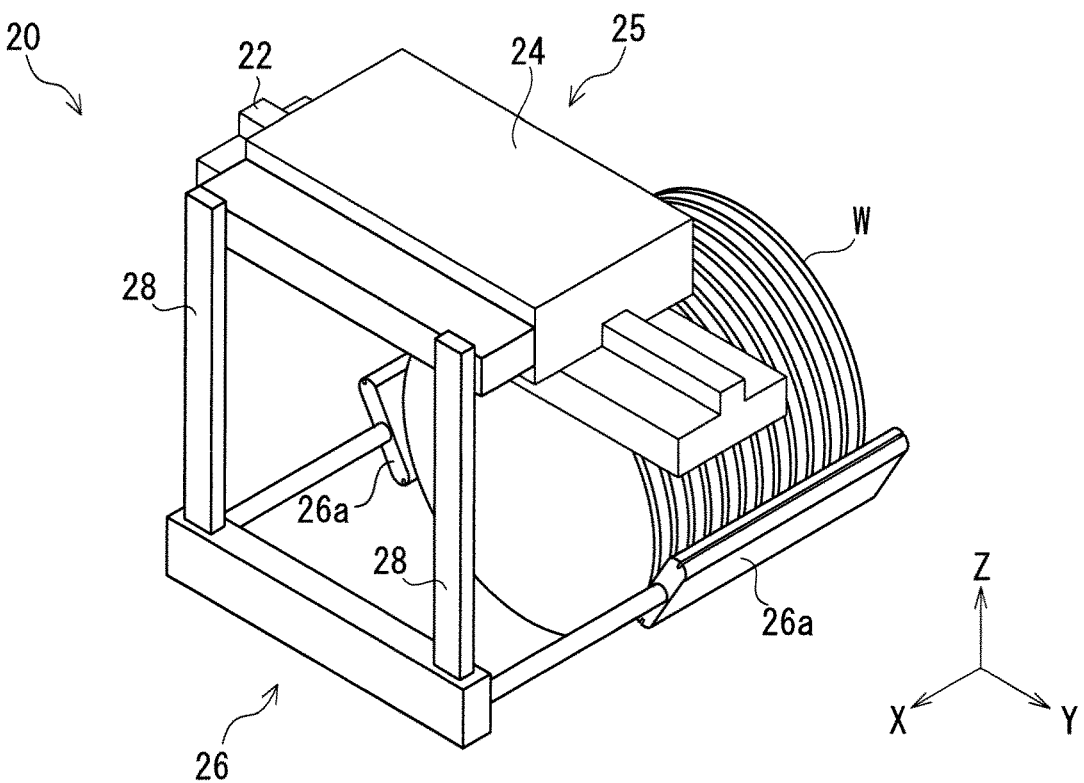
FIG. 7 is a perspective view of a second transport unit holding a substrate in the substrate processing device according to the first embodiment.
Figure 8:
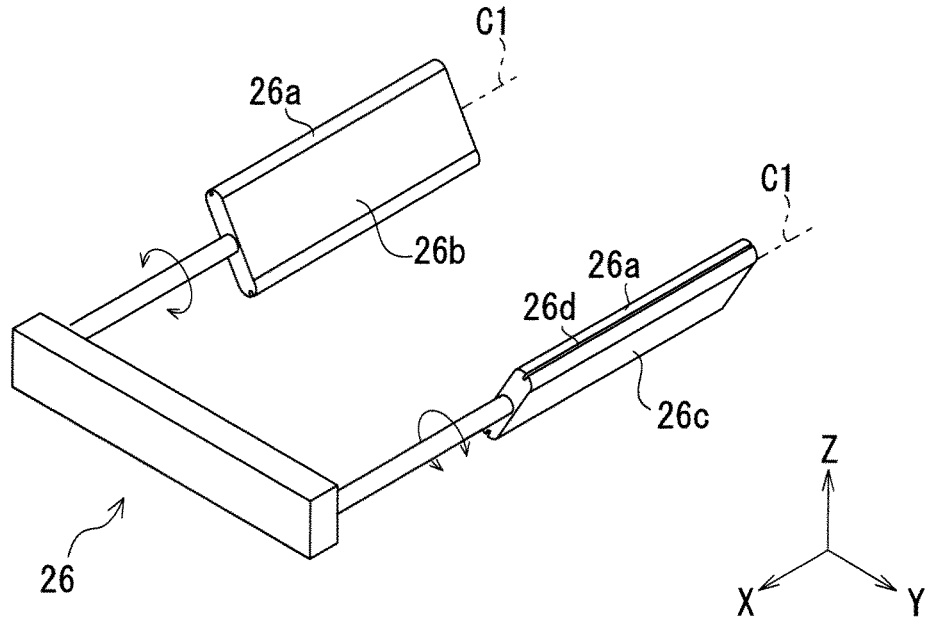
FIG. 8 is a perspective view illustrating a chuck in the second transport unit of the substrate processing device according to the first embodiment.
Figure 9:
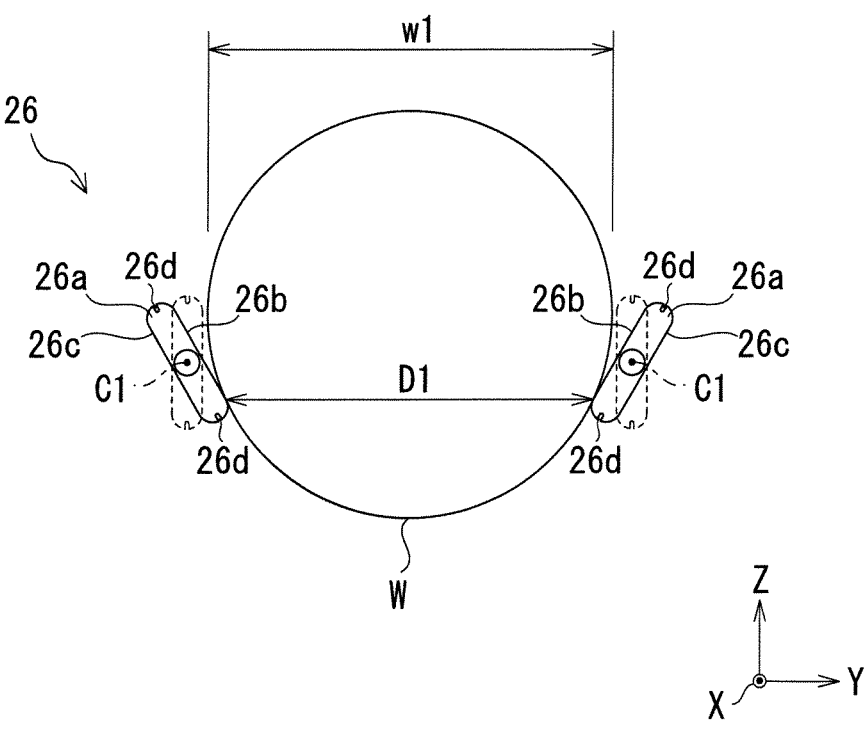
FIG. 9 is a diagram illustrating holding and releasing of a substrate of a chuck.

FIG. 7 is a perspective view of the second transport unit holding the substrate in the substrate processing device according to the first embodiment. Furthermore, FIG. 8 is a perspective view illustrating the chuck in the second transport unit. Moreover, FIG. 9 is a diagram illustrating holding and releasing of the substrate of the chuck.

As illustrated in FIG. 1, in the case of the present first embodiment, the moving head 24 of the actuator 25 of the second transport unit 20 moves on the rail 22 disposed in the front portion and the upper portion of the substrate processing device 10 (that is, each of the modules 12 to 18) and extending in the Y-axis direction (second direction). As illustrated in FIGS. 4A to 4C, in the chemical module 14, the actuator 25 is disposed on a side of the first tank 32 in the X-axis direction (first direction). Furthermore, in the case of the present first embodiment, the actuator 25 is located above the first tank 32. Therefore, the moving head 24 of the actuator 25 moves in the Y-axis direction above the first tank 32.

In the case of the present first embodiment, as illustrated in FIGS. 4A to 4C, in the chemical module 14, the actuator 25 of the second transport unit 20 is disposed in a drive space S2 isolated from a treatment space S1 in which the first tank 32 and the second tank 30 are disposed. The drive space S2 is provided above the treatment space S1. The actuator 25 is laid on an inner top plate portion 14a of the chemical module 14 that separates the treatment space S1 and the drive space S2. That is, the inner top plate portion 14a exists between the first tank 32 and the moving head 24 moving on the rail 22 of the actuator 25. The inner top plate portion 14a prevents foreign matter generated by the movement of the moving head 24 on the rail 22 from falling into the first tank 32.

Note that, in the present first embodiment, the chemical module 14 includes the inner top plate portion 14a and an outer top plate portion 14b disposed above the inner top plate portion. The actuator 25 is disposed in the drive space S2 formed between the inner top plate portion 14a and the outer top plate portion 14b.

As illustrated in FIG. 8, in the case of the present first embodiment, the chuck 26 in the second transport unit 20 includes a pair of chucking claws 26a that rotate about a rotation center line C1 extending in the X-axis direction (first direction) of the substrate processing device 10. The chucking claws 26a are disposed to face each other in the Y-axis direction (second direction) of the substrate processing device 10.

As illustrated in FIG. 9, each of the chucking claws 26a of the chuck 26 has a non-circular shape as viewed in an extending direction of the rotation center line C1 (that is, as viewed in the X-axis direction (first direction)), and has an oval coin shape in the case of the present first embodiment. In the case of the present first embodiment, the rotation center line C1 passes through a shape center of the chucking claw 26a as viewed in the first direction. Note that the rotation center line C1 may deviate from the shape center as long as the chucking claw 26a can hold the plurality of substrates W. Furthermore, as long as the function of the chuck 26 is not impaired, the shape of the chucking claw 26a is not particularly limited, and may be, for example, an elliptical shape, a rectangular shape, a triangular shape, or the like. Each of the chucking claws 26a includes a first support surface 26b and a second support surface 26c that support outer circumferential ends of the plurality of substrates W.

As illustrated in FIG. 9, the chuck 26 holds or releases the substrate W by rotation of each of the pair of chucking claws 26a. Specifically, each of the pair of chucking claws 26a takes a holding posture (posture indicated by solid line) such that a shortest distance D1 between the pair of chucking claws 26a is smaller than a size w1 of the substrate W in the Y-axis direction (second direction) of the substrate processing device 10, whereby the chuck 26 can hold the substrate W. Furthermore, when each of the pair of chucking claws 26a takes a release posture (posture indicated by a broken line) in which the shortest distance D1 becomes larger than the size w1 of the substrate W in the Y axis direction, the chuck 26 can release the substrate W. That is, when the pair of chucking claws 26a take the release posture, the substrate W can pass between the pair of chucking claws 26a in the Z-axis direction (third direction) of the substrate processing device 10. Note that the first and second support surfaces 26b and 26c of each of the pair of chucking claws 26a are formed with a plurality of grooves (not illustrated) that are engaged with the outer circumferential end of each of the plurality of substrates W to maintain the plurality of substrates W in a state of being spaced apart from each other by a predetermined distance.

As illustrated in FIGS. 4A to 4C, the chuck 26 is disposed above the first tank 32. By the movement of the moving head 24 of the actuator 25 in the Y-axis direction (second direction), the chuck 26 passes above the first tank 32 in the Y-axis direction. For this purpose, the second transport unit 20 includes an arm 28 that connects the moving head 24 and the chuck 26.

In the case of the present first embodiment, as illustrated in FIGS. 4A to 4C, the moving head 24 is disposed above the chuck 26. Therefore, the arm 28 connecting them extends in the height direction (Z-axis direction) of the substrate processing device 10 and supports the chuck 26 at a lower end thereof. The arm 28 extending in the height direction as described above is less likely to bend than the arm extending in the X-axis direction (first direction).

Specifically, in a case where the moving head 24 does not exist above the chuck 26, the arm 28 includes at least a portion extending in the X-axis direction (first direction). The portion of the arm 28 extending in the first direction as described above is likely to be greatly bent by its own weight and the weight of the chuck 26. In particular, when the moving head 24 is stopped, the arm 28 is likely to be greatly bent due to inertia of the chuck 26.

Furthermore, as illustrated in FIGS. 4A to 4C, the arm 28 extends at a position away from above the first tank 32. Specifically, as illustrated in FIG. 4B, the arm 28 does not extend in the treatment space S1 and in a space S3 above the first tank 32. As a result, the arm 28 does not pass above the first tank 32. This prevents foreign matter adhering to the arm 28 from falling into the first tank 32.

Furthermore, in the case of the present first embodiment, as illustrated in FIG. 4B, the chemical module 14 includes a hanging plate 14c that partitions the space S3 above the first tank 32 and the arm 28 as viewed in the Y-axis direction (second direction). The hanging plate 14c extends in the Z-axis direction (third direction) from the inner top plate portion 14a. This hanging plate 14c suppresses movement of foreign matter adhering to the arm 28 toward the first tank 32.

Note that, in the case of the present first embodiment, the chemical module 14 includes an outer wall portion 14d disposed outside the hanging plate 14c together with the hanging plate. The arm 28 moves between the hanging plate 14c and the outer wall portion 14d.

As described above, the chuck 26 of the second transport unit 20 passes above the first tank 32 in the Y-axis direction (second direction). Therefore, the transfer of the substrate W from the chuck 26 to the second chuck 34a of the first transport unit 34 (that is, the supply of the substrate W) is performed above the first tank 32.

Figure 10:
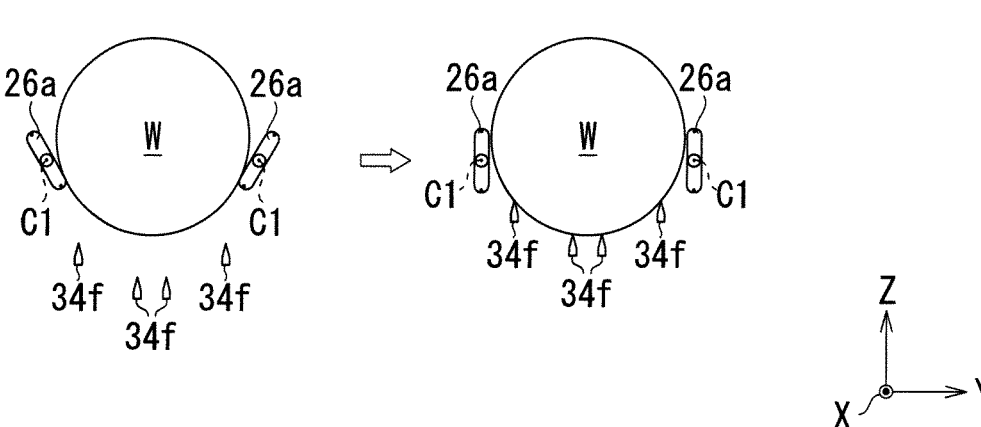
FIG. 10 is a diagram illustrating transfer of a substrate from the chuck of the second transport unit to a second chuck of the other first transport unit.

FIG. 10 is a diagram illustrating transfer of the substrate from the chuck of the second transport unit to the second chuck of the other first transport unit.

First, the chuck 26 of the second transport unit 20 that has received the plurality of substrates W in the loading module 12 arrives above the first tank 32 of the chemical module 14. Before or after the arrival, the plurality of support rods 34f of the second chuck 34a of the first transport unit 34 is disposed below the chuck 26. Next, the second chuck 34a rises, and the plurality of support rods 34f come into contact with the outer circumferential ends of the plurality of substrates W held by the chuck 26. When the plurality of support rods 34f come into contact with the plurality of substrates W, the pair of chucking claws 26a of the chuck 26 rotate to release the plurality of substrates W. As a result, the transfer of the substrate W from the chuck 26 to the second chuck 34a is completed. The second chuck 34a that has received the substrate W moves toward an upper side of the second tank 30 in the X-axis direction (first direction), and then moves into the second tank 30. When the movement of the second chuck 34a to the second tank 30 is completed, the chuck 26 becomes movable in the Y-axis direction (second direction).

The transfer of the substrate W from the first chuck 36a of the first transport unit 36 to the chuck 26 (that is, the collection of the substrate W) is also performed above the first tank 32.

Figure 11:
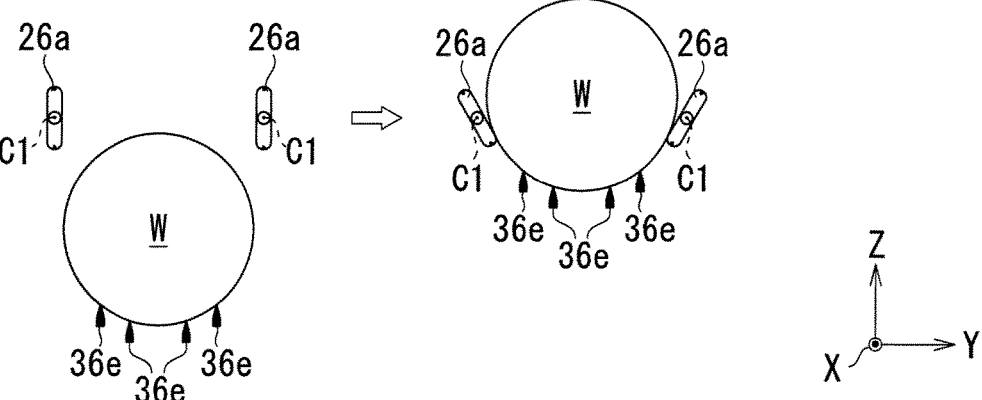
FIG. 11 is a diagram illustrating transfer of a substrate from the first chuck of one first transport unit to the chuck of the second transport unit.

FIG. 11 is a diagram illustrating transfer of the substrate from the first chuck of one of the first transport units to the chuck of the second transport unit.

First, the chuck 26 of the second transport unit 20 arrives above the first tank 32 of the chemical module 14. Then, the pair of chucking claws 26a of the chuck 26 takes the release posture in which the substrate W can pass between the pair of chucking claws in the Z-axis direction (third direction). Thereafter, the first chuck 36a of the first transport unit 36 moves upward from the inside of the first tank 32 in a state of holding the plurality of substrates W. When a part of the plurality of substrates W passes between the pair of chucking claws 26a, the pair of chucking claws 26a rotates to take the holding posture from the release posture. As a result, the transfer of the substrate W to the pair of chucking claws 26a is completed. When the transfer is completed, the first chuck 36a descends and moves into the first tank 32. When this movement is completed, the chuck 26 becomes movable in the Y-axis direction (second direction).

To supplement, when the substrate W is transferred from the first chuck 36a of the first transport unit 36 to the chuck 26, as illustrated in FIG. 4A, the arm 36b of the first transport unit 36 and the chucking claw 26a of the chuck 26 overlap each other as viewed in the Y axis direction (second direction). That is, the arm 36b is located between the pair of chucking claws 26a as viewed in an upward direction (as viewed in the Z-axis direction). In this state, since the chuck 26 cannot move in the Y-axis direction, the first chuck 36a that has transferred the plurality of substrates W to the chuck 26 retreats into the first tank 32. As a result, as illustrated in FIG. 4B, the chuck 26 can move in the Y-axis direction without being obstructed by the arm 36b.

Note that, in the case of the present first embodiment, as described above, the chuck 26 of the second transport unit 20 transports the substrate W from the loading module 12 to the second chuck 34a of the first transport unit 34 of the chemical module 14, and transports the substrate W from the first chuck 36a of the first transport unit 36 to the drying module 16. That is, the chuck 26 transports the substrate W before the treatment in a dry state, and transports the substrate W after the treatment wetted with the cleaning liquid in the first tank 32. Therefore, as illustrated in FIG. 9, the pair of chucking claws 26a of the chuck 26 includes the first support surface 26b that supports the dry substrate W and the second support surface 26c that supports the wet substrate W. This prevents the dry substrate W from being supported on the wet support surface. Note that, between the first support surface 26b and the second support surface 26c, a groove 26d extending in the X-axis direction (first direction) in which the rotation center line C1 of the chucking claw 26a extends is formed so that the cleaning liquid on the second support surface 26c does not move onto the first support surface 26b. Note that a nozzle (not illustrated) that sucks and collects the cleaning liquid accumulated in the groove 26d may be provided in the chucking claw 26a.

The configuration of the substrate processing device 10 has been described so far. Hereinafter, operations related to the chemical module 14 of the substrate processing device 10, that is, operations of the first transport units 34 and 36 and the second transport unit 20 will be described.

FIGS. 12A to 12J illustrate a plurality of operations in one example of substrate processing executed by the substrate processing device. Note that, in each of FIGS. 12A to 12J, a side view (left view) and a front view (right view) of the chemical module are illustrated.

Figure 12A:
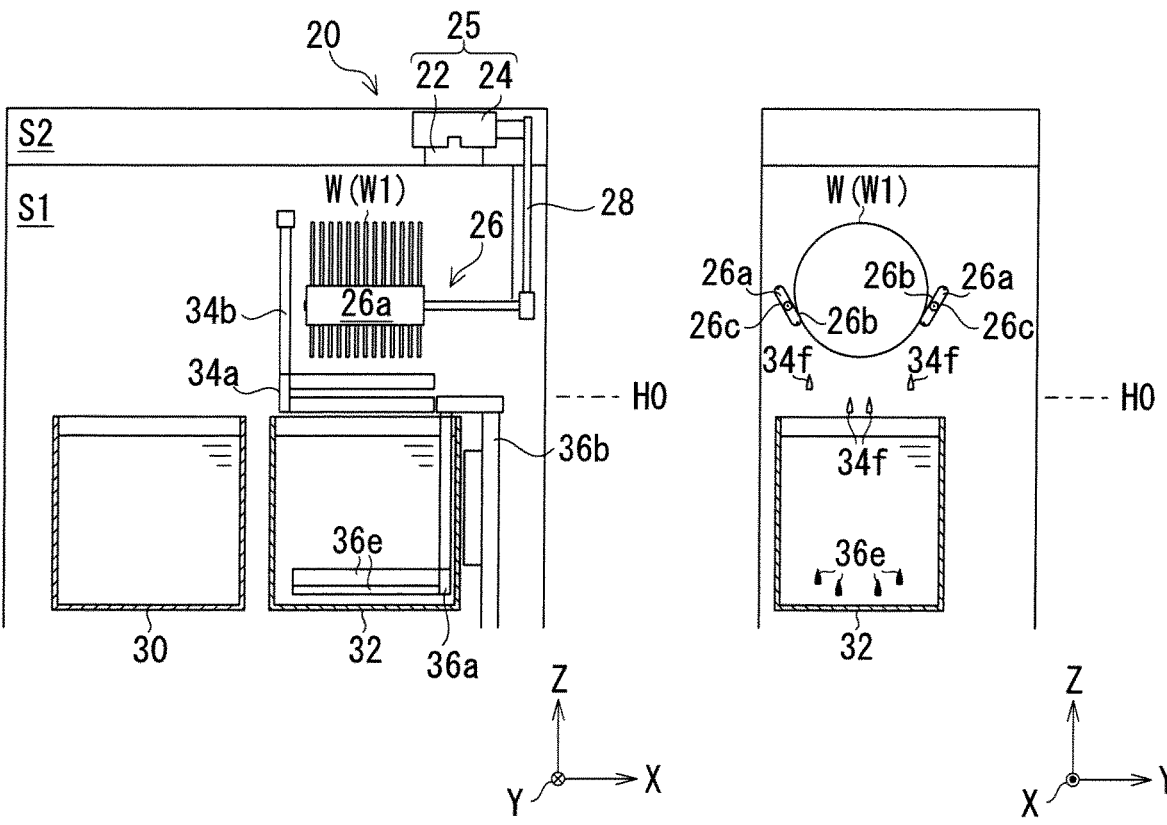
FIG. 12A is a diagram illustrating one operation in one example of substrate processing executed by the substrate processing device.

As illustrated in FIG. 12A, first, the second chuck 34a of the first transport unit 34 is on standby at a position (initial position) of a reference height H0 above the first tank 32. Furthermore, the first chuck 36a of the first transport unit 36 is on standby in the first tank 32. In this state, the chuck 26 of the second transport unit 20 transports the plurality of substrates W (preceding substrates W1) to be processed to a position above the first tank 32 at a level higher than the reference height H0.

Figures 12B, 12C:
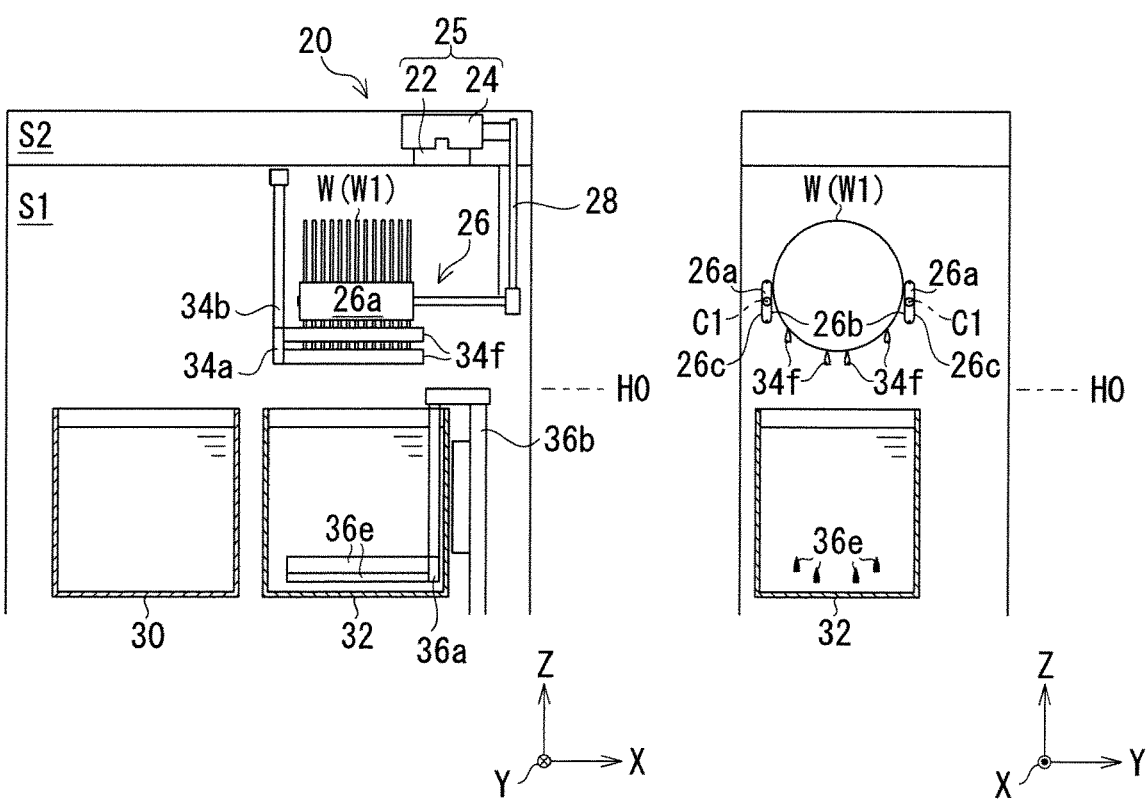
FIG. 12B is a diagram illustrating an operation subsequent to the operation illustrated in FIG. 12A.
FIG. 12C is a diagram illustrating an operation subsequent to the operation illustrated in FIG. 12B.

Next, as illustrated in FIG. 12B, the second chuck 34a of the first transport unit 34 is raised, so that the plurality of substrates W (preceding substrates W1) held by the chuck 26 of the second transport unit 20 via the first support surface 26b is placed on the plurality of support rods 34f of the second chuck 34a. Note that at this time, the plurality of support rods 34f come into contact with the outer circumferential ends of the substrates W (preceding substrates W1) positioned between the chucking claws 26a of the chuck 26. When the plurality of substrates W (preceding substrates W1) are placed on the plurality of support rods 34f of the second chuck 34a, the chuck 26 of the second transport unit 20 releases the plurality of substrates W.

Subsequently, as illustrated in FIG. 12C, the second chuck 34a of the first transport unit 34 on which the plurality of substrates W (preceding substrates W1) is placed moves in the X-axis direction (first direction) toward the upper side of the second tank 30, and descends into the second tank 30 after the movement. As a result, the plurality of substrates W (preceding substrates W1) are immersed in the chemical liquid in the second tank 30 and treated with the chemical liquid. When the descent of the second chuck 34a into the second tank 30 is completed, the second transport unit 20 moves to the loading module 12 to receive a substrate (subsequent substrate) to be treated next.

Figure 12D:
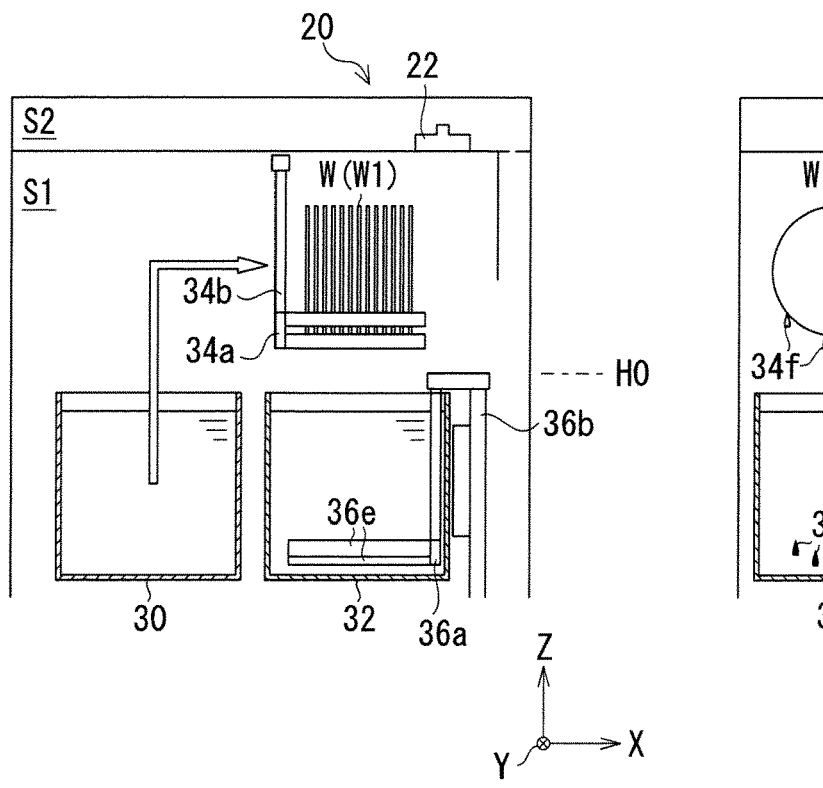
FIG. 12D is a diagram illustrating an operation subsequent to the operation illustrated in FIG. 12C.
Figure 12D:
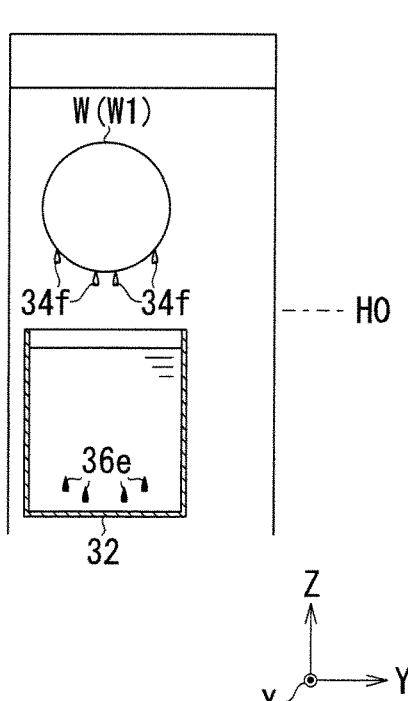

Subsequently, as illustrated in FIG. 12D, when the treatment of the substrate W (preceding substrate W1) with the chemical liquid is completed, the second chuck 34a rises toward the upper side of the second tank 30, and moves in the X-axis direction (first direction) toward the upper side of the first tank 32 after the rising. As a result, the second chuck 34a of the first transport unit 34 in a state of holding the plurality of substrates W (preceding substrates W1) subjected to the chemical liquid treatment is disposed above the first chuck 36a of the first transport unit 36.

Figure 12E:
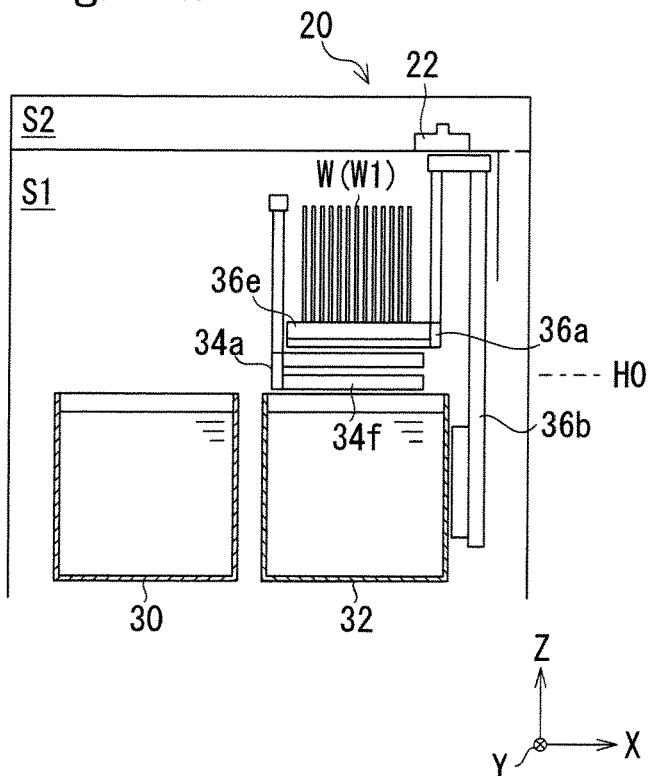
FIG. 12E is a diagram illustrating an operation subsequent to the operation illustrated in FIG. 12D.
Figure 12E:
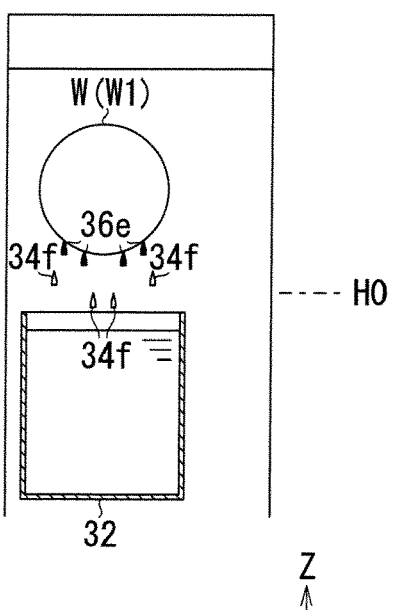

Subsequently, as illustrated in FIG. 12E, the first chuck 36a of the first transport unit 36 is raised, so that the plurality of substrates W (preceding substrate W1) placed on the plurality of support rods 34f of the second chuck 34a are placed on the plurality of support rods 36e of the first chuck 36a. Then, when the second chuck 34a descends to the initial position of the reference height H0, the transfer of the substrate W (preceding substrate W1) from the second chuck 34a to the first chuck 36a is completed.

Figure 12F:
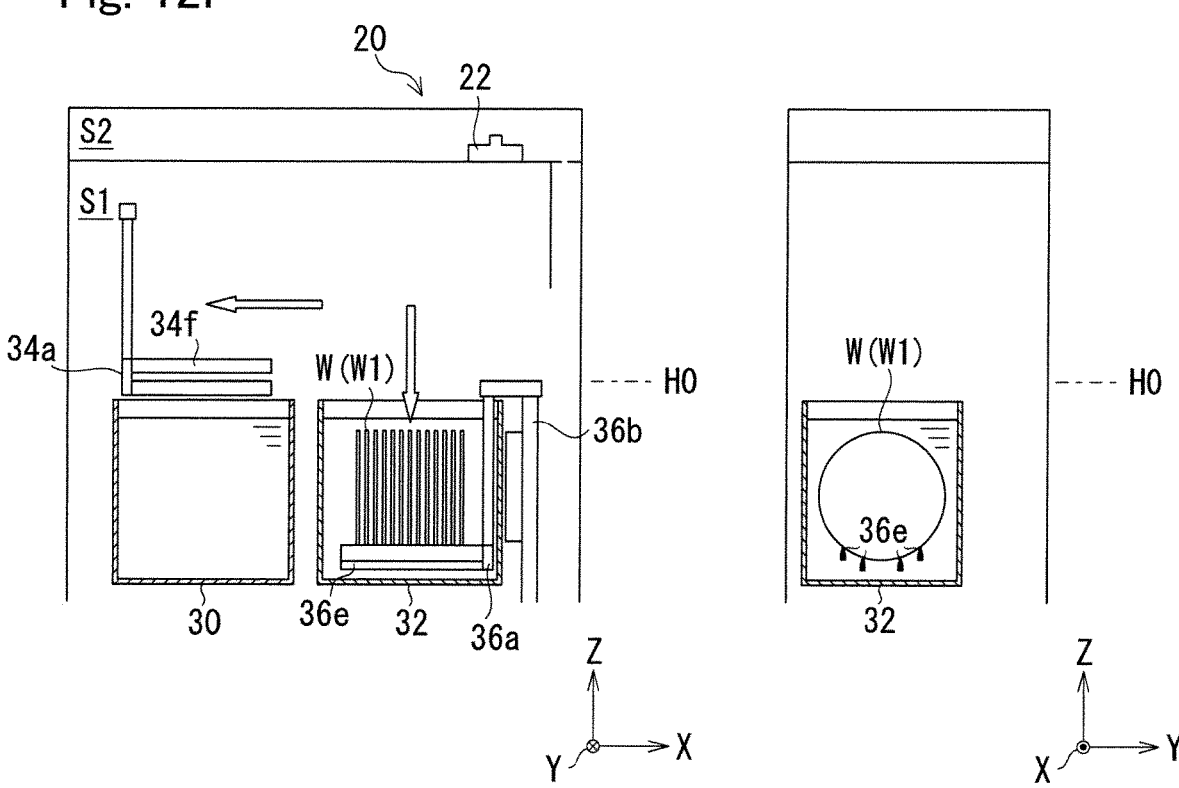
FIG. 12F is a diagram illustrating an operation subsequent to the operation illustrated in FIG. 12E.

Subsequently, as illustrated in FIG. 12F, when the transfer of the substrate W (preceding substrate W1) from the second chuck 34a to the first chuck 36a is completed, the second chuck 34a moves above the second tank 30. As a result, the first chuck 36a holding the plurality of substrates W (preceding substrates W1) can descend toward the inside of the first tank 32. As the first chuck 36a descends into the first tank 32, the plurality of substrates W (preceding substrates W1) are immersed in the cleaning liquid in the first tank 32 and cleaned.

Figure 12G:
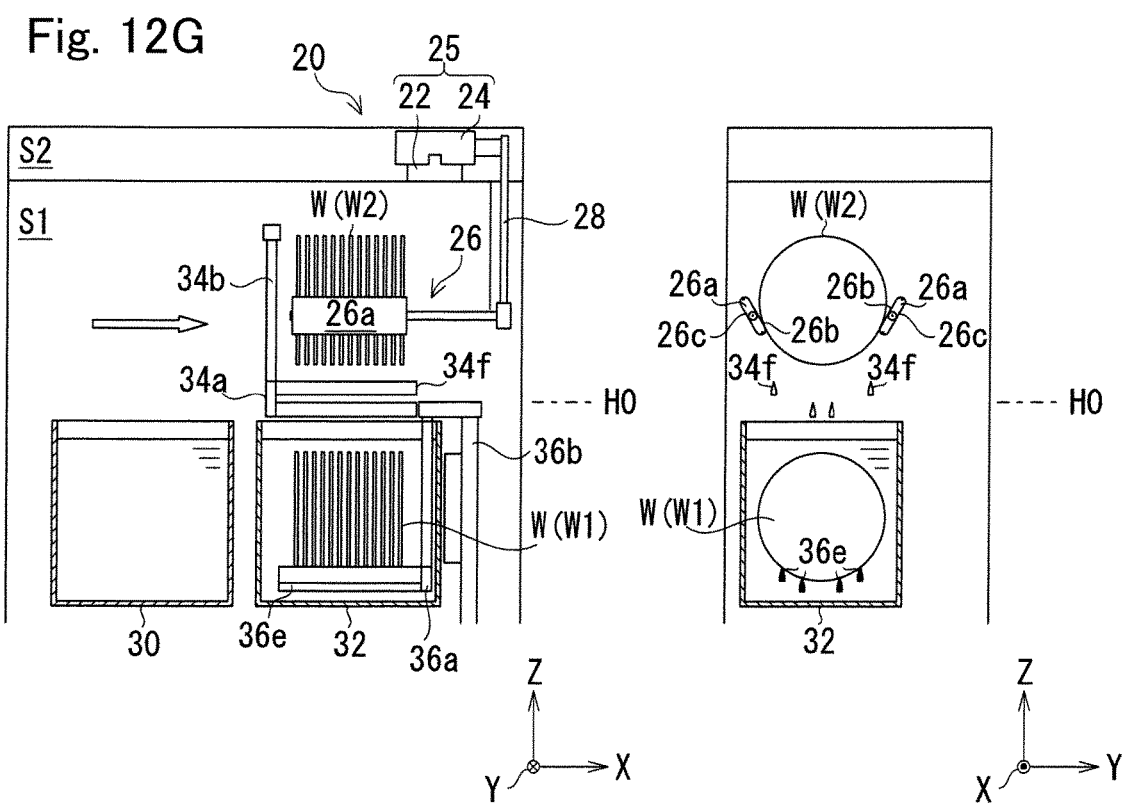
FIG. 12G is a diagram illustrating an operation subsequent to the operation illustrated in FIG. 12F.

Subsequently, as illustrated in FIG. 12G, the second chuck 34a moves above the first tank 32. Above the second chuck 34a, the chuck 26 of the second transport unit 20 in a state of holding the plurality of substrates W (the substrate W2 subsequent to the preceding substrate W1) newly received by the loading module 12 via the first support surface 26b is disposed.

Figures 12H, 12I:
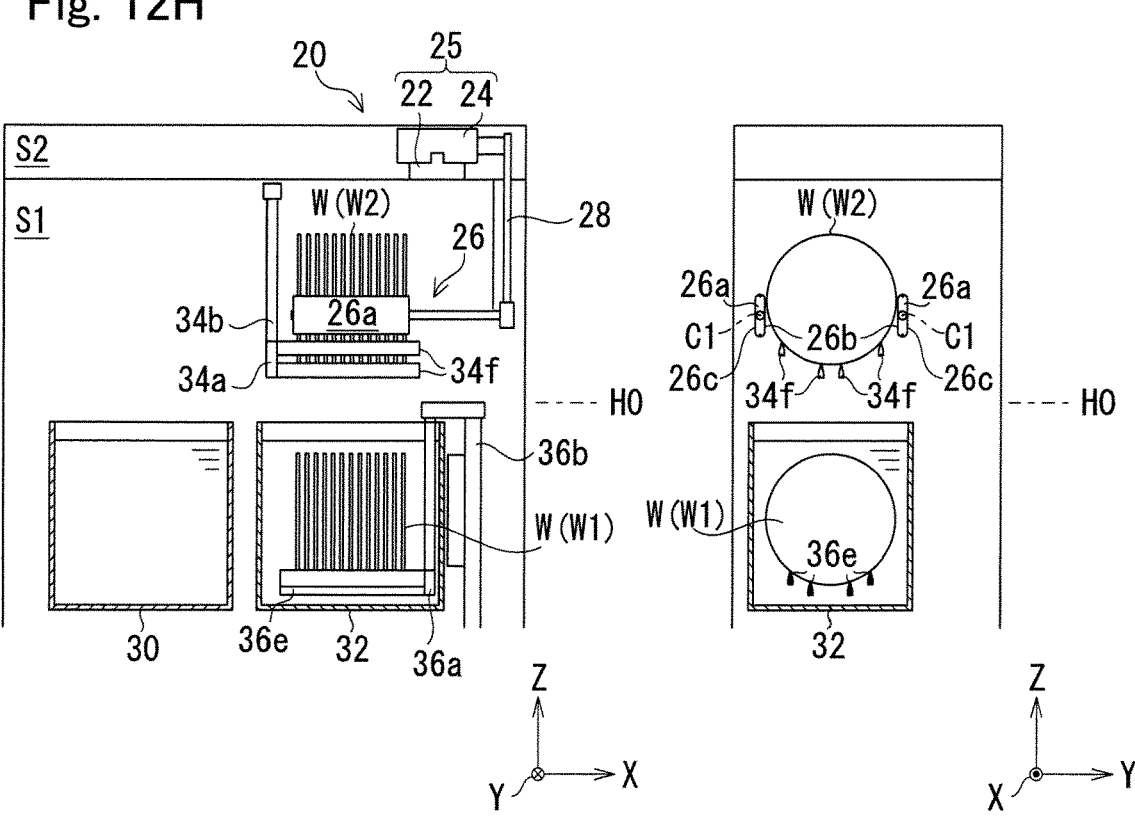
FIG. 12H is a diagram illustrating an operation subsequent to the operation illustrated in FIG. 12G.
FIG. 12I is a diagram illustrating an operation subsequent to the operation illustrated in FIG. 12H.

Subsequently, as illustrated in FIG. 12H, the second chuck 34a is raised, and the plurality of substrates W (subsequent substrates W2) held by the chuck 26 of the second transport unit 20 via the first support surface 26b are placed on the plurality of support rods 34f of the second chuck 34a. When the plurality of substrates W (subsequent substrates W2) are placed on the plurality of support rods 34f of the second chuck 34a, the chuck 26 of the second transport unit 20 releases the plurality of substrates W.

Subsequently, as illustrated in FIG. 12I, the second chuck 34a of the first transport unit 34 in a state of holding the plurality of substrates W (subsequent substrates W2) moves in the X-axis direction (first direction) toward the upper side of the second tank 30, and descends into the second tank 30 after the movement. As a result, the plurality of substrates W (subsequent substrates W2) are immersed in the chemical liquid in the second tank 30 and treated with the chemical liquid. As a result, in the chemical module 14 of the substrate processing device 10, the plurality of substrates W (preceding substrates W1) are cleaned in the first tank 32, and the plurality of substrates W (subsequent substrates W2) are subjected to the chemical liquid treatment in the second tank 30.

Figure 12J:
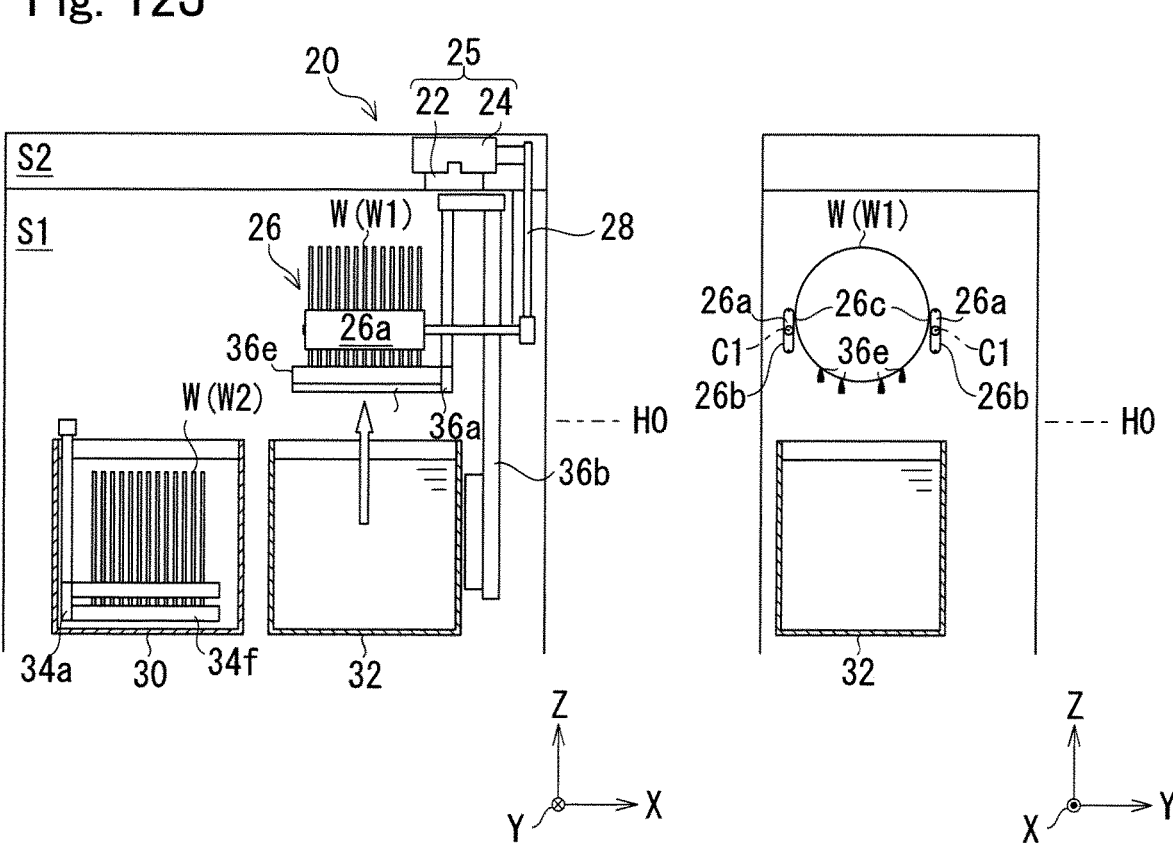
FIG. 12J is a diagram illustrating an operation subsequent to the operation illustrated in FIG. 12I.

When the cleaning of the plurality of substrates W (preceding substrate W1) in the first tank 32 is completed, the first chuck 36a rises as illustrated in FIG. 12J. The plurality of substrates W (preceding substrates W1) placed on the plurality of support rods 36e of the raised first chuck 36a is held by the chuck 26 of the second transport unit 20 via the second support surface 26c. By holding the plurality of substrates W (preceding substrates W1) wetted with the cleaning liquid via the second support surface 26c, the first support surface 26b does not get wet. Thereafter, the first chuck 36a retreats into the first tank 32, and the second transport unit 20 transports the substrate W (preceding substrate W1) to the drying module 16. When the chuck 26 of the second transport unit 20 exits the chemical module 14, the chemical module 14 returns to the state illustrated in FIG. 12C. Thereafter, by repeatedly executing the operations illustrated in FIGS. 12C to 12J, the plurality of substrates W are continuously processed by the substrate processing device 10.

According to the present first embodiment as described above, in the substrate processing device 10 that processes the substrates W using the first and second tanks 32 and 30, it is possible to increase the operating rate of each of the first and second tanks 32 and 30 to improve the throughput of the substrate processing device 10.

Specifically, by the two first transport units 34 and 36, the first and second tanks 32 and 30 are maintained in a state where the substrate Wis present therein without being empty, and the operating rates of the first and second tanks 32 and 30 are improved. For example, the operating rates of the first and second tanks 32 and 30 are improved as compared with a case where only the first transport unit 34 is used. As a result, the throughput of the substrate processing device 10 is improved.

Second Embodiment

The present second embodiment is different from the first embodiment in that a first transport unit and a second transport unit are different. Therefore, the present second embodiment will be described focusing on differences from the first embodiment. Note that constituent elements substantially the same as the constituent elements of the first embodiment described above are denoted by the same reference signs.

Figure 13:
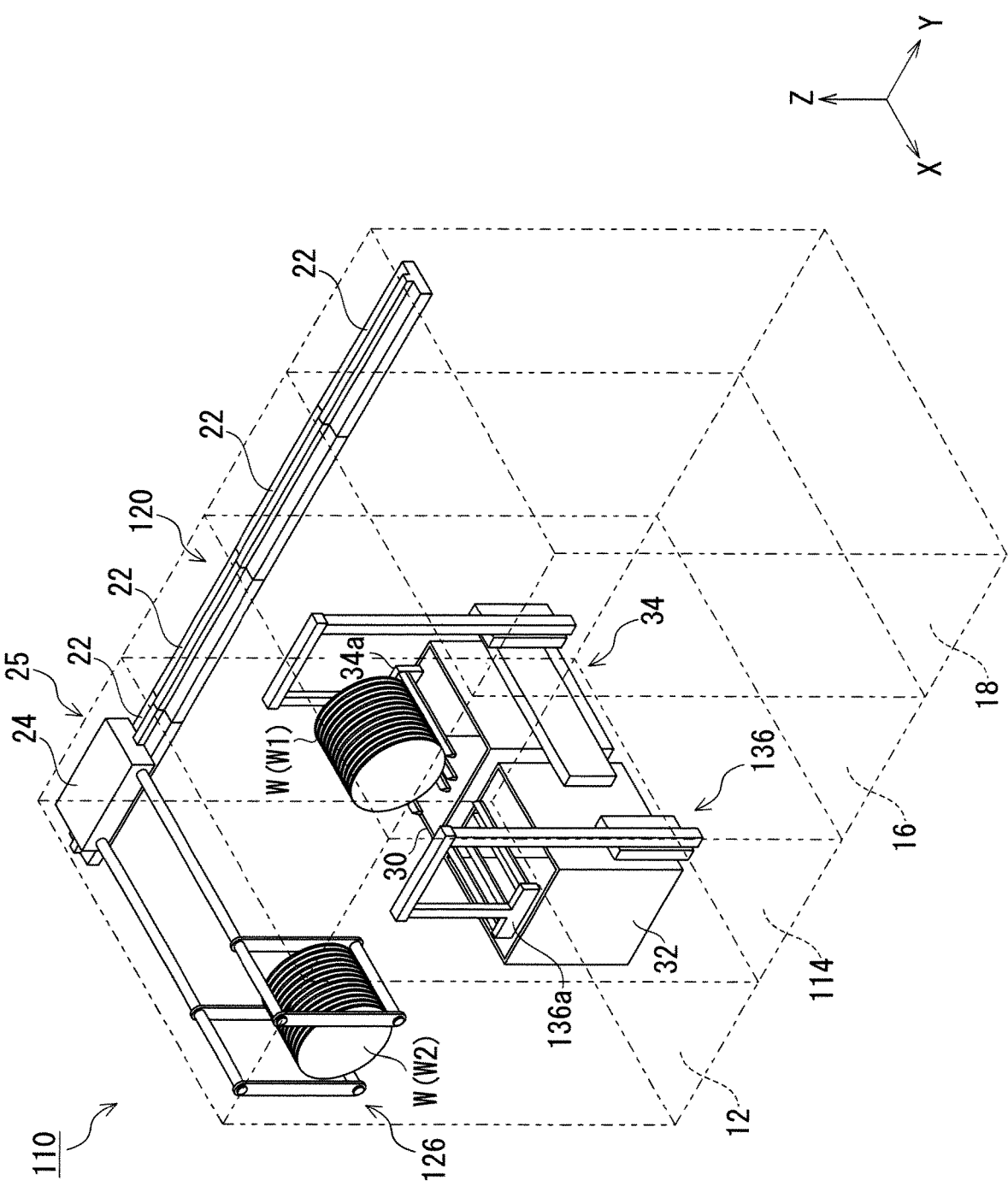
FIG. 13 is a perspective view of a substrate processing device according to a second embodiment.
Figure 14:
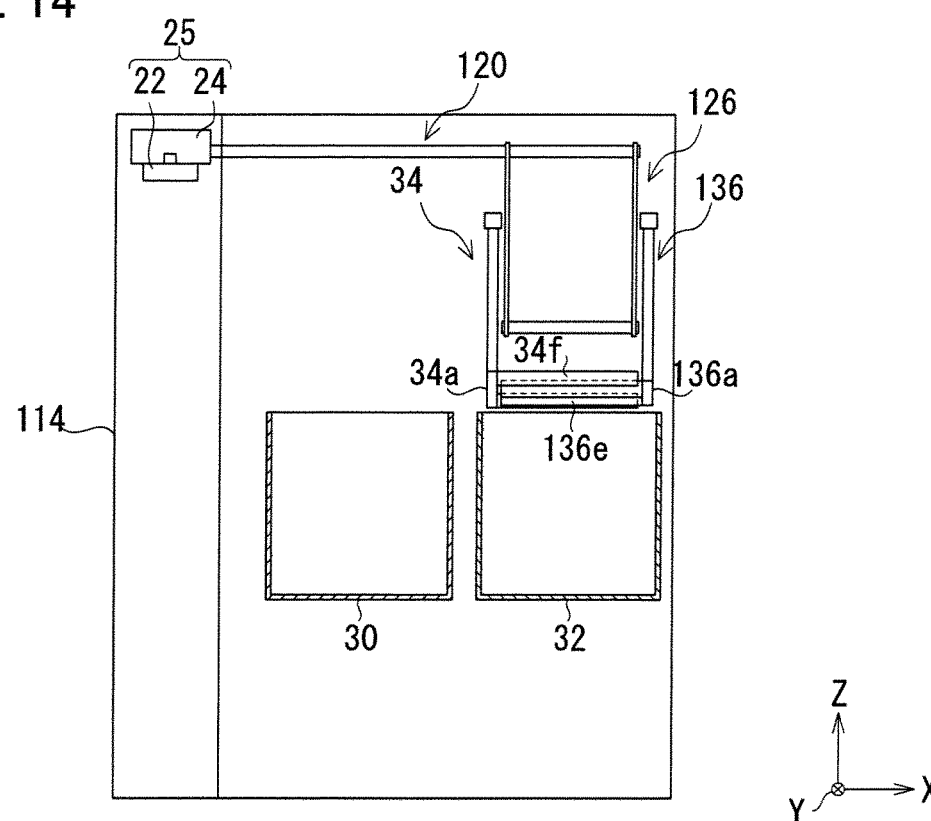
FIG. 14 is a side view of a chemical module in the substrate processing device according to the second embodiment.
Figure 15:
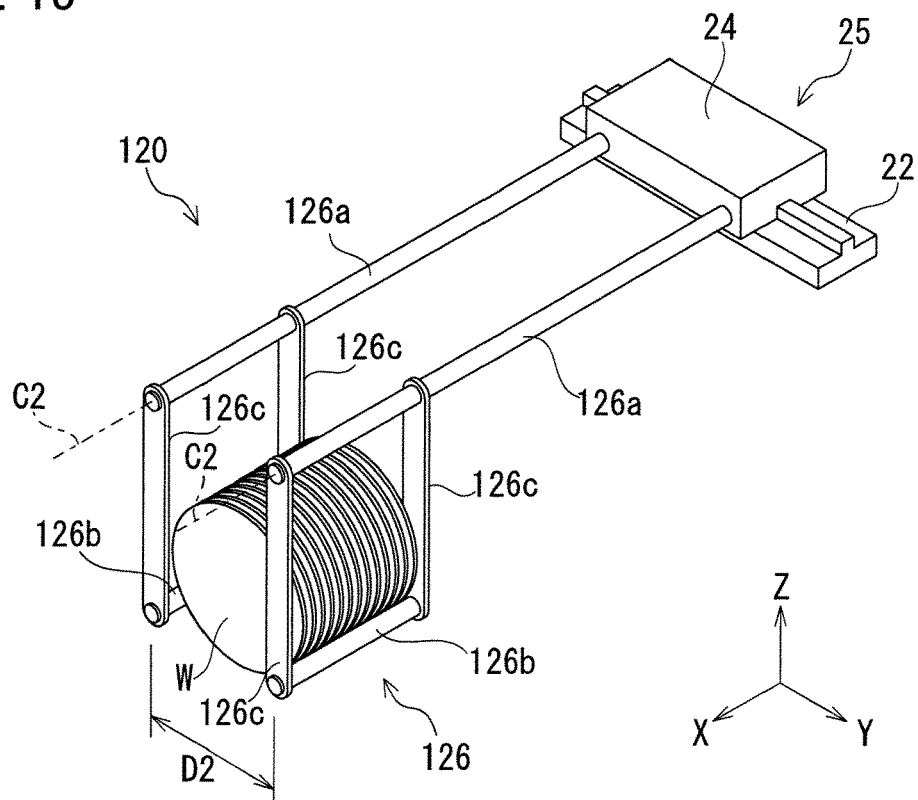
FIG. 15 is a perspective view of a second transport unit in the substrate processing device according to the second embodiment.
Figure 16:
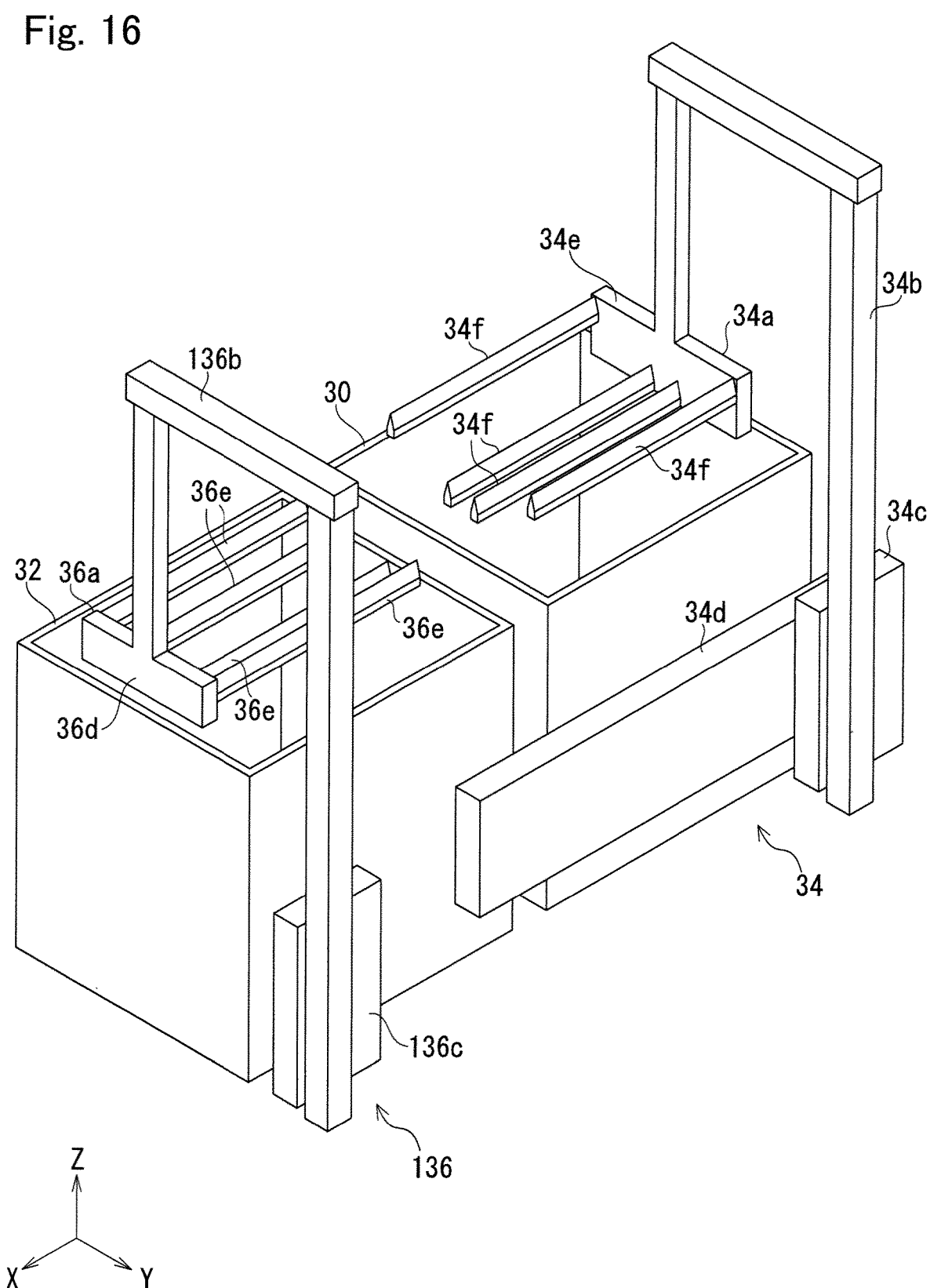
FIG. 16 is a perspective view illustrating a plurality of first transport units in the substrate processing device according to the second embodiment.

FIG. 13 is a perspective view of a substrate processing device according to the second embodiment. Furthermore, FIG. 14 is a side view of a chemical module in the substrate processing device according to the second embodiment. Moreover, FIG. 15 is a perspective view of a second transport unit in the substrate processing device according to the second embodiment. FIG. 16 is a perspective view illustrating a plurality of first transport units in the substrate processing device according to the second embodiment.

As illustrated in FIGS. 13 and 14, in a substrate processing device 110 according to the present second embodiment, an actuator 25 of a second transport unit 120 is disposed on a side of a second tank 30 in the X-axis direction (first direction) of the substrate processing device 110. Furthermore, the actuator 25 of the second transport unit 120 is disposed in an upper portion of the substrate processing device 110.

Furthermore, as illustrated in FIG. 16, in a chemical module 114 of the substrate processing device 110 according to the present second embodiment, one first transport unit 136 is different from the first transport unit 36 according to the first embodiment described above. Specifically, a first chuck 136a of the first transport unit 136 according to the present second embodiment is substantially the same as the first chuck 36a of the first embodiment described above. On the other hand, an arm 136b that supports the first chuck 136a of the first transport unit 136 and an actuator 136c that raises and lowers the arm 136b are different in position. In the present second embodiment, the arm 136b and the actuator 136c are not disposed in front of the first tank 32, but are disposed on one side in the Y-axis direction (second direction) with respect to a first tank 32, similarly to an arm 34b and an actuator 34c of a first transport unit 34. As a result, the size of the substrate processing device in the X-axis direction (first direction) is reduced, and the substrate processing device can be downsized.

As illustrated in FIG. 15, in the case of the present second embodiment, a chuck 126 of the second transport unit 120 includes two rotation shafts 126a extending forward from a moving head 24 in the X-axis direction (first direction) and extending in parallel with each other, two support bars 126b extending in the X-axis direction and on which a plurality of substrates W is placed, and a plurality of links 126c connecting the rotation shafts 126a and the support bars 126b. Specifically, each of the support bars 126b is suspended and supported by the corresponding rotation shaft 126a via two one-links 126c. Furthermore, each of the rotation shafts 126a is rotated about a rotation center line C2 extending in the first direction by a motor (not illustrated) mounted on a moving head 24 of the actuator 25 so that a distance D2 between the two support bars 126b can be changed. By changing the distance D2, the chuck 126 can hold the substrate W or release the substrate W. Note that the support bar 126b is formed with a plurality of grooves (not illustrated) that engage with the outer circumferential ends of the plurality of substrates W to maintain the plurality of substrates W at predetermined intervals.

In the case of the present second embodiment, as illustrated in FIG. 14, the chuck 126 of the second transport unit 120 moves in the Y-axis direction (second direction) above the first tank 32. That is, above the first tank 32, the chuck 126 of the second transport unit 120 supplies the substrate W to the second chuck 34a of the first transport unit 34 and collects the substrate W from the first chuck 136a of the first transport unit 136.

According to the present second embodiment as described above, similarly to the first embodiment described above, in the substrate processing device 110 that processes the substrates W using the first and second tanks 32 and 30, the throughput of the substrate processing device 110 can be improved by increasing the operation rate of each of the first and second tanks 32 and 30.

Third Embodiment

The present third embodiment is different from the first embodiment in that a second transport unit is different.

Specifically, in the case of the above-described first embodiment, as illustrated in FIG. 1, the substrate processing device 10 includes one second transport unit 20. Therefore, in the chemical module 14, the supply of the substrate W to the second chuck 34a of the first transport unit 34 and the collection of the substrate W from the first chuck 36a of the first transport unit 36 are executed by this one second transport unit 20. Unlike this, a substrate processing device according to the present third embodiment includes a second transport unit that supplies the substrate W to a second chuck 34a of a first transport unit 34 and another second transport unit that collects the substrate W from a first chuck 36a of a first transport unit 36. The third embodiment will be described focusing on this different point. Note that constituent elements substantially the same as the constituent elements of the first embodiment described above are denoted by the same reference signs.

Figure 17:
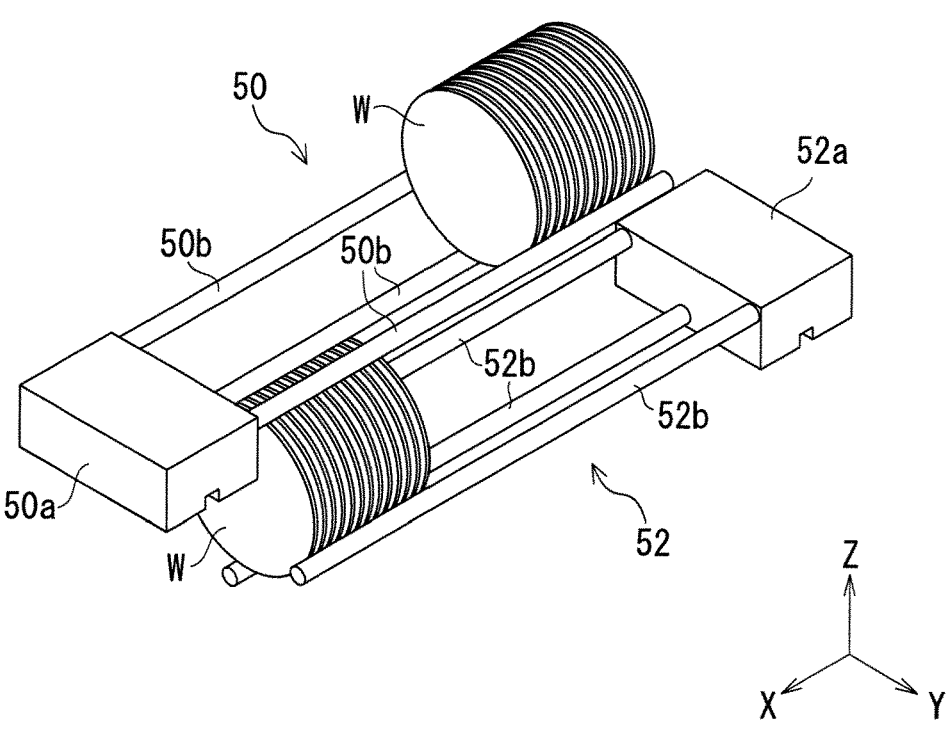
FIG. 17 is a perspective view of a plurality of second transport units in a substrate processing device according to a third embodiment.
Figure 18A:
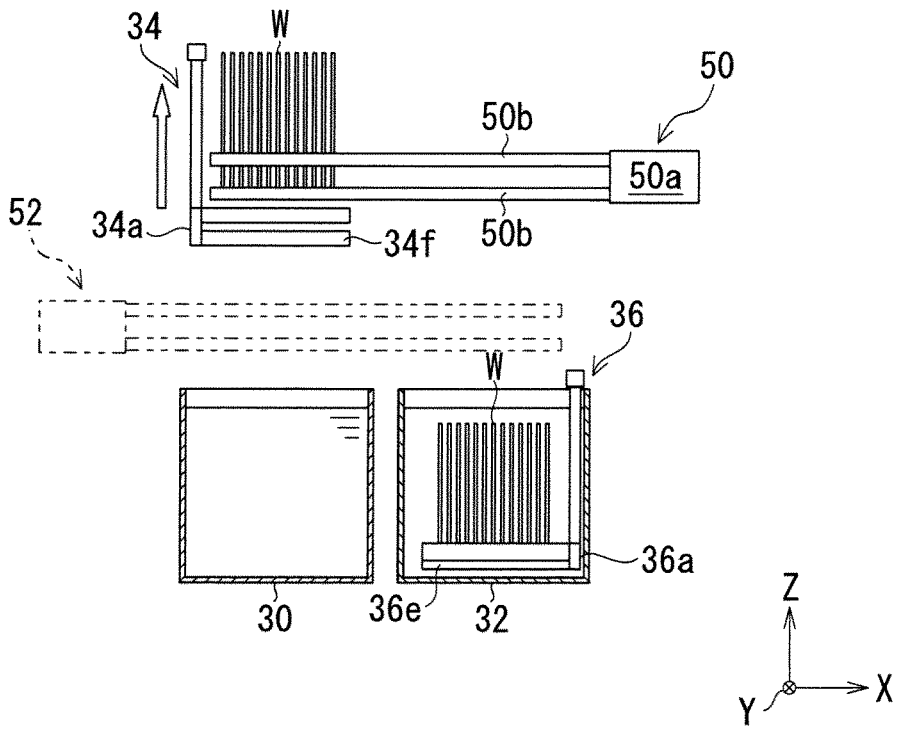
FIG. 18A is a side view illustrating supply of a plurality of substrates from one second transport unit to a second chuck of the other first transport unit.
Figure 18B:
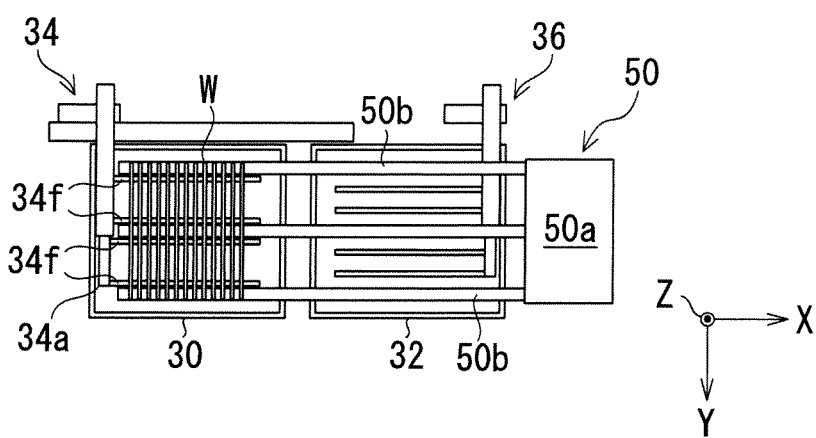
FIG. 18B is a top view illustrating supply of a plurality of substrates from one second transport unit to a second chuck of the other first transport unit.
Figure 19A:
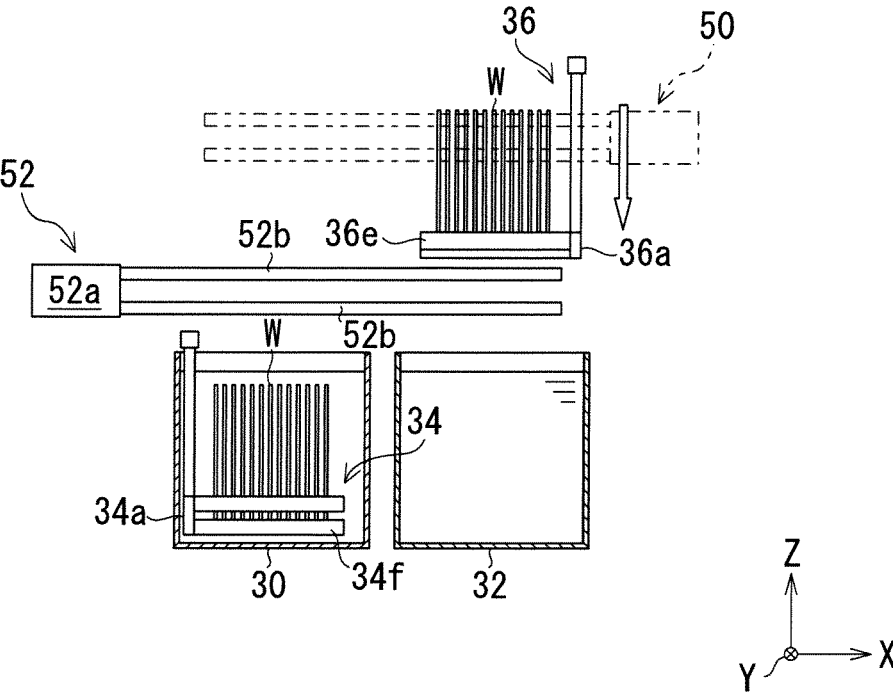
FIG. 19A is a side view illustrating collection of a plurality of substrates from a first chuck of one first transport unit to the other second transport unit.
Figure 19B:
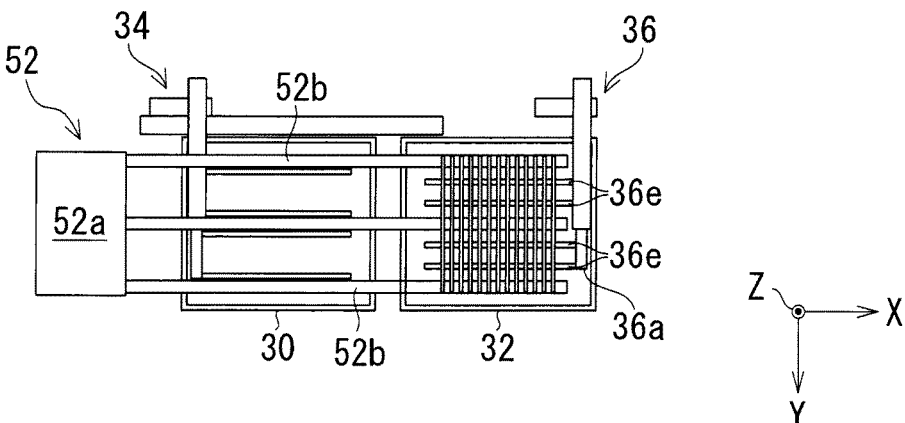
FIG. 19B is a top view illustrating collection of a plurality of substrates from a first chuck of one first transport unit to the other second transport unit.

FIG. 17 is a perspective view of a plurality of second transport units in the substrate processing device according to the third embodiment. Furthermore, FIGS. 18A and 18B are a side view and a top view illustrating supply of a plurality of substrates from one second transport unit to a second chuck of the other first transport unit. FIGS. 19A and 19B are a side view and a top view illustrating collection of the plurality of substrates from a first chuck of one first transport unit to the other second transport unit.

As illustrated in FIG. 17, the substrate processing device according to the present third embodiment includes two second transport units 50 and 52 as a second transport unit. One second transport unit 50 supplies a plurality of substrates W to the second chuck 34a of the first transport unit 34, but does not collect the plurality of substrates W held by the first chuck 36a of the first transport unit 36. On the other hand, the other second transport unit 52 collects the plurality of substrates W held by the first chuck 36a of the first transport unit 36, but does not supply the plurality of substrates W to the second chuck 34*a* of the first transport unit 34.

Furthermore, the two second transport units 50 and 52 hold the plurality of substrates W by a method different from that of the second transport unit 20 of the above-described first embodiment. The second transport units 50 and 52 include moving heads 50*a* and 52*a* of actuators that move in the Y-axis direction (second direction), and a plurality of support rods 50*b* and 52*b* that extend from the moving heads 50*a* and 52*a* in the X-axis direction (first direction) of the substrate processing device 10 and on which a plurality of substrates W is placed. Note that illustration of rails of actuators on which the moving heads 50*a* and 52*a* move is omitted.

As illustrated in FIGS. 18A and 18B, the moving head 50*a* of the second transport unit 50 is located in front of a first tank 32 as viewed from above (as viewed in the Z-axis direction). The plurality of support rods 50*b* extends from the moving head 50*a* toward an upper side of a second tank 30. Furthermore, the plurality of support rods 50*b* do not overlap a plurality of support rods 34*f* when viewed from above so that the plurality of support rods 34*f* of the second chuck 34*a* of the first transport unit 34 can pass through the plurality of support rods 50*b* in the Z-axis direction (third direction).

In the case of the present third embodiment, as illustrated in FIG. 18A, the supply of the plurality of substrates W from the second transport unit 50 to the second chuck 34*a* of the first transport unit 34 is performed above the second tank 30. After the second chuck 34*a* is disposed below the support rod 50*b* of the second transport unit 50 that holds the plurality of substrates W, the second chuck 34*a* rises. Due to the rising, the plurality of support rods 34*f* of the second chuck 34*a* pass between the plurality of support rods 50*b*, whereby the plurality of substrates W are placed on the plurality of support rods 34*f*. Thereafter, when the second transport unit 50 moves from above the second tank 30, the second chuck 34*a* holding the plurality of substrates W can descend toward the inside of the second tank 30. Note that, when the plurality of substrates W are supplied from the second transport unit 50 to the second chuck 34*a*, the first chuck 36*a* of the first transport unit 36 is located in the first tank 32 and avoids contact with the support rods 50*b* of the second transport unit 50.

As illustrated in FIGS. 19A and 19B, the moving head 52*a* of the second transport unit 52 is located behind the second tank 32 as viewed from above (as viewed in the Z-axis direction). The plurality of support rods 52*b* extends from the moving head 52*a* toward the upper side of the first tank 32. Furthermore, the plurality of support rods 52*b* do not overlap the plurality of support rods 36*e* when viewed from above such that the plurality of support rods 36*e* of the first chuck 36*a* of the first transport unit 36 can pass between the plurality of support rods 52*b* in the Z-axis direction (third direction).

In the case of the present third embodiment, the collection of the plurality of substrates W from the first chuck 36*a* of the first transport unit 36 to the second transport unit 52 is performed above the first tank 32. After the first chuck 36*a* that holds the plurality of substrates W is disposed above the second transport unit 52, the first chuck 36*a* descends. Due to the descent, the plurality of support rods 36*e* of the first chuck 36*a* pass between the plurality of support rods 52*b*, whereby the plurality of substrates W are placed on the plurality of support rods 52*b*. Note that when the plurality of substrates W are collected from the first chuck 36*a* to the second transport unit 52, the second chuck 34*a* of the first transport unit 34 is located in the second tank 30 and avoids contact with the support rods 52*b* of the second transport unit 52.

Note that, as illustrated in FIGS. 18A and 19A, the second transport units 50 and 52 move in the Y-axis direction (second direction) of the substrate processing device 10 at different height levels. That is, the second transport units 50 and 52 are spaced apart from each other in the Z-axis direction (third direction) so as not to interfere with each other even when moving while holding the plurality of substrates W.

According to the present third embodiment as described above, similarly to the first embodiment described above, in the substrate processing device that processes the substrate W using the first and second tanks 32 and 30, the operating rate of each of the first and second tanks 32 and 30 can be increased to improve the throughput of the substrate processing device.

In particular, the present third embodiment is advantageous in a case where there are a plurality of chemical modules in the substrate processing device, or in a case where the immersion time of the substrate W in the second tank 30 and the immersion time of the substrate W in the first tank 32 are significantly different.

The embodiments of the present disclosure have been described above with reference to the plurality of embodiments. However, the embodiments of the present disclosure are not limited thereto.

For example, in the case of the above-described first embodiment, the second tank 30 located on the rear side of the substrate processing device 10 is a chemical liquid tank, and the first tank 32 located on the front side of the substrate processing device 10 is a cleaning tank. However, the embodiment of the present disclosure is not limited thereto. For example, the second tank 30 may be used as a cleaning tank, and the first tank 32 may be used as a chemical liquid tank. In this case, since the second chuck 34*a* and the first chuck 36*a* of the first embodiment described above are configured to be able to transfer the substrates W to and from each other, the plurality of substrates W is transferred from the first chuck 36*a* of the first transport unit 36 to the second chuck 34*a* of the first transport unit 34.

Furthermore, in the case of the above-described first embodiment, the second transport unit 20 is movable in the Y-axis direction (second direction) but does not move in the Z-axis direction (third direction). However, the embodiment of the present disclosure is not limited thereto. The second transport unit of the substrate processing device according to the embodiment of the present disclosure may have any form as long as the second transport unit can supply and collect the plurality of substrates W to and from each of the first chuck of the first transport unit and the second chuck of the first transport.

Moreover, in the case of the above-described first embodiment, the second chuck 34*a* of the other first transport unit 34 is movable and movable up and down between the position above the second tank 30 and the position above the first tank 32. On the other hand, the first chuck 36*a* of one first transport unit 36 merely moves up and down without moving between the position above the second tank 30 and the position above the first tank 32. However, the embodiment of the present disclosure is not limited thereto. The first chuck of one first transport unit may also move between the position above the first tank and the position above the second tank. As a result, the degree of freedom in setting a transfer position of the substrate from the second chuck to the first chuck and a collection position of the substrate from the first chuck to the second transport unit is improved.

Note that, in the case of the above-described first embodiment, the transfer position of the substrate W from the second chuck 34a of the first transport unit 34 to the first chuck 36a of the first transport unit 36, the supply position of the substrate W from the second transport unit 20 to the second chuck 34a, and the collection position of the substrate W from the first chuck 36a to the second transport unit 20 are set above the first tank 32.

Consequently, the structures of second transport unit 20 and first transport unit 36 are simplified. That is, if the chuck 26 of the second transport unit 20 and the first chuck 36a of the first transport unit 36 can move in one direction, they can play their roles (the former moves only in the Y-axis direction (second direction) of the substrate processing device 10, and the latter moves only in the Z-axis direction (third direction)).

Moreover, in the case of the above-described first embodiment, as illustrated in FIGS. 3A and 5, the second chuck 34a of the first transport unit 34 and the first chuck 36a of the first transport unit 36 are comb-shaped chucks as viewed from above (as viewed in the Z-axis direction). However, the embodiment of the present disclosure is not limited thereto.

Figure 20:
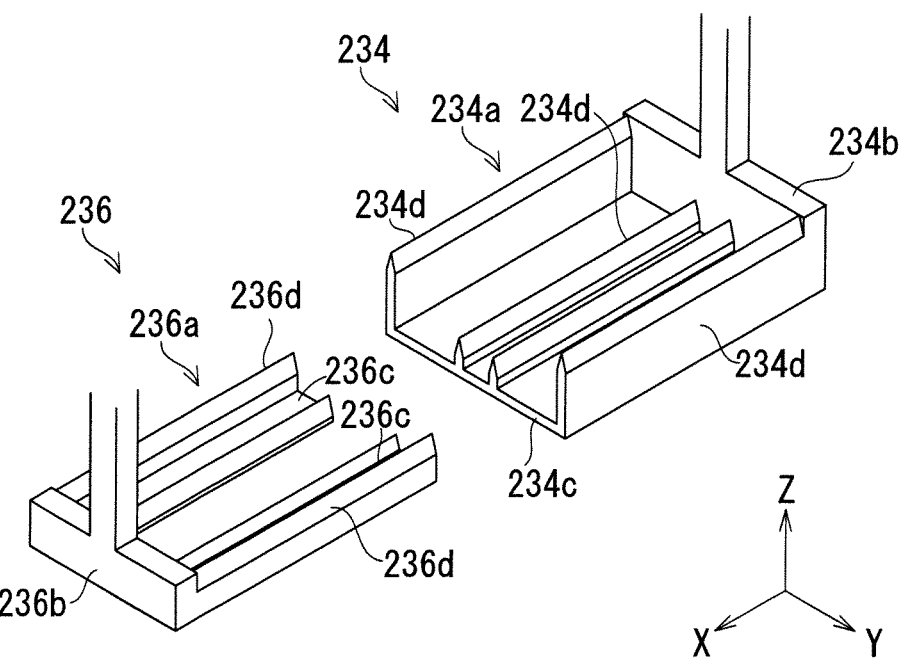
FIG. 20 is a perspective view of a first chuck of one first transport unit and a second chuck of the other first transport unit in a substrate processing device according to another embodiment.

FIG. 20 is a perspective view of a first chuck of one first transport unit and a second chuck of the other first transport unit in a substrate processing device according to another embodiment. Furthermore, FIG. 21 is a diagram illustrating transfer of the substrate between the first chuck of one first transport unit and the second chuck of the other first transport unit.

Figure 21:
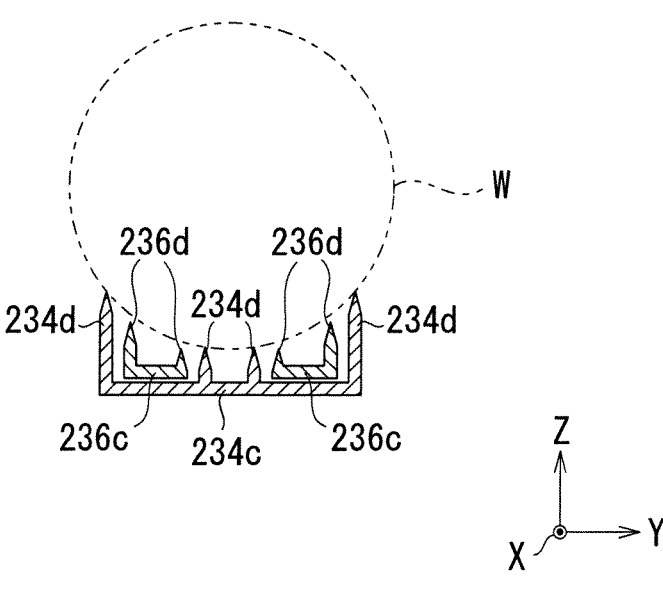
FIG. 21 is a view illustrating transfer of a substrate between the first chuck of one first transport unit and the second chuck of the other first transport unit.

As illustrated in FIGS. 20 and 21, in the substrate processing device according to another embodiment, a second chuck 234a of a first transport unit 234 includes a main body portion 234b, a plate-shaped cantilever portion 234c extending forward in the X-axis direction (first direction) from the main body portion 234b, and a plurality of ridge portions 234d extending in the X-axis direction while protruding in the Z-axis direction (third direction) from the cantilever portion 234c. A first chuck 236a of a first transport unit 236 includes a main body portion 236b, two plate-shaped cantilever portions 236c extending rearward in the X-axis direction from the main body portion 236b, and a plurality of ridge portions 236d extending in the X-axis direction while protruding in the Z-axis direction from each of the two cantilever portions 236c. The plurality of substrates W are placed on the plurality of ridge portions 234d of the second chuck 234a and the plurality of ridge portions 236d of the first chuck 236a.

When the plurality of substrates W are transferred from the second chuck 234a to the first chuck 236a, the second chuck 234a moves in the X-axis direction (first direction) toward the first chuck 236a. With this movement, as illustrated in FIG. 21, the two cantilever portions 236c of the first chuck 236a enter a gap between the plurality of substrates W and the cantilever portion 234c of the second chuck 234a. After the entry, when the first chuck 236a rises, the plurality of substrates W are placed on the plurality of ridge portions 236d of the first chuck 236a.

In the case of the first and second chucks 236a and 234a illustrated in FIGS. 20 and 21, unlike the first and second chucks 36a and 34a of the above-described first embodiment, the chucks cannot pass through each other in the Z-axis direction (third direction). However, similarly to the first and second chucks 36a and 34a of the first embodiment, the first and second chucks 236a and 234a can transfer the substrate W to each other.

That is, in a broad sense, a substrate processing module according to an embodiment of the present disclosure includes: a first tank and a second tank that are arranged in a first direction and in which a substrate can be disposed; and two first transport units that transport the substrate, in which one of the first transport units includes a first chuck that is movable up and down and is disposed in the first tank in a state of holding a substrate, the other of the first transport units includes a second chuck that is movable up and down and is disposed in the second tank in a state of holding a substrate, at least one of the first chuck and the second chuck is movable between a position above the first tank and a position above the second tank, and the first chuck and the second chuck are configured to be able to transfer a substrate therebetween.

Furthermore, a substrate processing device according to another embodiment of the present disclosure is a substrate processing device including the above-described substrate processing module and another module connected to the substrate processing module in a second direction intersecting the first direction.

As described above, the above-described embodiments have been described as examples of the technique in the present disclosure. To that end, the drawings and detailed description are provided. Therefore, the constituent elements described in the drawings and the detailed description may include not only constituent elements essential for solving the problem but also constituent elements that are not essential for solving the problem in order to illustrate the above-described technique. Therefore, it should not be immediately recognized that these non-essential constituent elements are essential based on the fact that these non-essential constituent elements are described in the drawings and the detailed description.

Furthermore, since the above-described embodiments are intended to illustrate the technique in the present disclosure, various changes, replacements, additions, omissions, and the like can be made within the scope of the claims or equivalents thereof.

INDUSTRIAL APPLICABILITY

The present disclosure is applicable to a substrate processing device that processes a substrate using a plurality of tanks.

EXPLANATION OF REFERENCES 10 substrate processing device
14 substrate processing module (chemical module)
30 second tank
32 first tank
34 first transport unit
34a second chuck
36 first transport unit
36a first chuck
W substrate

The invention claimed is:

1. A substrate processing module comprising:
   a first tank and a second tank that are arranged in a first direction and in which a substrate can be disposed;
   two first transport units that transport the substrate in the first direction; and
   a second transport unit that transports the substrate in a second direction, wherein one of the first transport units includes a first chuck that is movable up and down and is disposed in the first tank in a state of holding a substrate, another of the first transport units includes a second chuck that is movable up and down and is disposed in the second tank in a state of holding a substrate, at least one of the first chuck and the second chuck is movable in the first direction between a position above the first tank and a position above the second tank, the second direction intersects the first direction and the up and down direction, and the first chuck and the second chuck are configured to be able to transfer a substrate between the first chuck and the second chuck.

2. The substrate processing module according to claim 1, wherein the first chuck has projections on which the substrate is placed, the second chuck has projections on which the substrate is placed, and the first chuck and the second chuck can pass through each other in an elevating direction.

3. The substrate processing module according to claim 1, wherein the first tank is a cleaning tank, and the second tank is a chemical liquid tank.

4. The substrate processing module according to claim 1, wherein the second chuck is movable between the position above the first tank and the position above the second tank.

5. The substrate processing module according to claim 1, wherein the first chuck receives the substrate held by the second chuck at the position above the first tank.

6. The substrate processing module according to claim 1, wherein the second transport unit supplies the substrate to the second chuck and collects the substrate held by the first chuck.

7. The substrate processing module according to claim 6, wherein the second transport unit supplies the substrate to the second chuck and collects the substrate supported by the first chuck at the position above the first tank.

8. A substrate processing device comprising: the substrate processing module according to claim 1; and another module connected to the substrate processing module in the second direction intersecting the first direction and the up and down direction.

*   *   *   *   *